(12) United States Patent
Selmeier

(10) Patent No.: US 6,747,530 B1
(45) Date of Patent: Jun. 8, 2004

(54) SURFACE ACOUSTIC WAVE (SAW) FILTER OF THE REACTANCE FILTER TYPE EXHIBITING IMPROVED STOP BAND SUPPRESSION AND METHOD FOR OPTIMIZING THE STOP BAND SUPPRESSION

(75) Inventor: Peter Selmeier, Maitenbeth (DE)

(73) Assignee: Epcos AG, Munich (DE)

( * ) Notice: Subject to any disclaimer, the term of this patent is extended or adjusted under 35 U.S.C. 154(b) by 22 days.

(21) Appl. No.: 10/030,856

(22) PCT Filed: Jul. 6, 2000

(86) PCT No.: PCT/DE00/02202
§ 371 (c)(1),
(2), (4) Date: Jan. 10, 2002

(87) PCT Pub. No.: WO01/05031
PCT Pub. Date: Jan. 18, 2001

(30) Foreign Application Priority Data

Jul. 13, 1999 (DE) .......................................... 199 32 649

(51) Int. Cl.[7] ................................................ H03H 9/64
(52) U.S. Cl. .................................... 333/193; 310/313 B
(58) Field of Search ................................ 333/193–196; 310/313 R, 313 B, 313 C, 313 D

(56) References Cited

U.S. PATENT DOCUMENTS

| | | | |
|---|---|---|---|
| 5,506,552 A | * | 4/1996 | Seki et al. .................. 333/195 |
| 5,877,662 A | * | 3/1999 | Kobayashi et al. ......... 333/195 |
| 5,914,646 A | * | 6/1999 | Hashimoto .................. 333/195 |
| 5,945,893 A | * | 8/1999 | Plessky et al. .............. 333/195 |
| 5,999,069 A | * | 12/1999 | Ushiroku .................... 333/193 |
| 6,137,380 A | * | 10/2000 | Ushiroku et al. ........... 333/193 |
| 6,150,904 A | * | 11/2000 | Taniguchi et al. .......... 333/193 |
| 6,246,148 B1 | * | 6/2001 | Flowers et al. ......... 310/313 B |
| 6,369,672 B1 | * | 4/2002 | Ikada ......................... 333/193 |

FOREIGN PATENT DOCUMENTS

| | | |
|---|---|---|
| DE | 197 30 710 A1 | 1/1999 |
| DE | 198 30 315 A1 | 1/1999 |
| EP | 0 862 266 A2 | 9/1996 |
| EP | 0 878 902 A1 | 11/1998 |
| EP | 0 897 218 A2 | 2/1999 |
| EP | 0 936 735 A2 | 8/1999 |
| JP | 9-167937 | * 6/1997 |
| JP | 9-261002 | * 10/1997 |

OTHER PUBLICATIONS

H. Furusato, et al., "Analysis and Optimal SAW Ladder Filter Design Including Bonding Wire and Package Impedance", (1997) IEEE Ultrasonics Symposium, pp. 175–178, Oct. 1997.

* cited by examiner

Primary Examiner—Barbara Summons
(74) Attorney, Agent, or Firm—Schiff Hardin LLP

(57) ABSTRACT

In a SAW filter of the reactance type having at least two SAW resonators in two parallel branches and a SAW resonator in a serial branch, the invention provides that an electrical connection fashioned on the substrate of the ground sides of the two SAW resonators in the parallel branches is done before the bonding to the housing in order to achieve a shift of the pole point belonging to the parallel branch to a lower frequency.

8 Claims, 18 Drawing Sheets

SURFACE ACOUSTIC WAVE (SAW) FILTER OF THE REACTANCE FILTER TYPE EXHIBITING IMPROVED STOP BAND SUPPRESSION AND METHOD FOR OPTIMIZING THE STOP BAND SUPPRESSION

BACKGROUND OF THE INVENTION

1. Field of the Invention

The present invention is directed to a surface-active wave filter (SAW) and, specifically, to a SAW filter of the reactance filter type with improved stop band suppression as well as to a method for the optimization of the stop band suppression.

2. Description of the Related Art

Reactance filters are known from classical filter technology. When SAW resonators are employed for the individual resonators instead of discrete elements (inductors and capacitors), then this is called a SAW filter according to the reactance filter type.

Given SAW filters of the reactance filter type, SAW resonators are employed as impedance elements. FIG. 1 shows the schematic structure of a known resonator. It comprises metallic structures on the surface of a piezoelectric substrate and has a terminal pair 1-1 and 1-2 to which an interdigital transducer 1-4 is connected for the transformation of electrical energy into acoustic energy. A reflector1-3 and 1-5 is respectively arranged at both sides of the interdigital transducer 1-4 along the acoustic axis in order to prevent the acoustic energy from escaping.

FIG. 2, on the left, shows the equivalent circuit diagram for a SAW resonator R and shows the symbol employed for the resonator at the right. A series resonant circuit composed of dynamic inductance $L_1$, dynamic capacitor $C_1$ and dynamic resistor $R_1$ (when taking losses into consideration) is located in the first branch of the parallel circuit, and the static capacitor $C_0$ of the interdigital transducer is located in the second branch. The series resonant circuit reflects the behavior of the resonator in the resonance case, i.e., in the range of the resonant frequency $f_r$. The static capacity reflects the behavior in the frequency ranges $f<<f_r$ and $f>>f_r$. The dynamic capacitor $C_1$ is proportional to the static capacitor $C_0$ of the interdigital transducer:

$$C_1 \sim C_0 \quad (1.1)$$

A resonator has a resonant frequency $f_r$ and an anti-resonant frequency $f_a$. The following applies to the resonant frequency $f_r$:

$$f_r = \frac{1}{2\pi} \sqrt{L_1 * C_1} \quad (1.2)$$

The following applies for the anti-resonant frequency $f_a$ of a resonator:

$$f_a = f_r * \sqrt{1 + \frac{C_1}{C_0}} \quad (1.3)$$

The basic unit of a SAW reactance filter is a "basic element" as shown in FIG. 3. It is composed of a first resonator $R_1$ with resonant frequency $f_{rp}$ and appertaining anti-resonant frequency $f_{ap}$ in the parallel branch and of a second resonator $R_2$ with resonant frequency $f_{rs}$ and appertaining anti-resonant frequency $f_{as}$ in the serial branch. The frequency curve of the admittance $Y_p$ of the resonator $R_1$ in the parallel branch and the frequency curve of the impedance $Z_s$ of the resonator $R_2$ in the serial branch are shown in FIG. 4. For producing a band-pass filter with the middle frequency $f_0$, the resonant frequencies of the two resonators have the following relationship:

$$f_{ap} \approx f_{rs} \approx f_0 \quad (1.4)$$

Each basic element is fundamentally viewed as a two-port element with the terminals 3-1 or 3-2 of port 1 and the terminal 3-3 or 3-4 of port 2 (see FIG. 3). At the same time, the terminal 3-1 is the input and the terminal 3-3 is the output of the series resonator. The input of the parallel resonator is connected to the terminal 3-1. The terminals 3-2 and 3-4 represent the reference ground for an asymmetrical operation. The output 3-4 of the parallel resonator that faces toward the reference ground is referred below as the output side or ground side of the parallel resonator. The inductance $L_{ser}$ that lies between the output side of the parallel resonator and the reference ground reflects the connection to the housing ground in the real structure.

The selection level of the SAW filter according to the reactance filter type is defined, first, by the relationship $C_{0p}/C_{0s}$ of static capacitor $C_{0p}$ in the parallel branch and static capacitor $C_{0s}$ in the series branch and is defined, second, by the number of basic elements connected following one another (in a cascaded manner, i.e., in series).

The basic elements when they are connected in series are usually circuit-adapted, i.e., they are respectively mirrored. FIG. 5 and FIG. 6 show two examples of a reactance filter in which respectively two basic elements are cascaded. The output impedance 5-1 ($Z_{out}$) or 6-1 ($Z_{in}$) of the first basic element is equal to the input impedance 5-2 or 6-2 of the second basic element, resulting in a minimization of losses due to mismatching. Many structures are possible or known for reactance filters with respect to the number and arrangement of the basic elements.

Resonators of the same type (series resonator or parallel resonator) lying immediately behind one another can also be respectively combined to form one in which the overall capacity remains the same. The interconnection of a filter according to FIG. 7 corresponds in effect to that of a filter according to FIG. 8.

FIGS. 9 and 10 show the typical, actual structure of a SAW filter on a piezoelectric substrate 9-1 in a ceramic housing 9-0 and the typical connecting technique with bond wires 9-8 through 9-12 or 10-9.

At the output side 9-15 through 9-17, the parallel resonators R1, R3 and R5 are connected to the housing ground pads 9-4, 9-5 and 9-7 via bond wires 9-9, 9-10 and 9-12.

As a result of the typical structuring technique (see FIG. 9 and FIG. 10), series inductances between, for example, the output side 9-17 of the parallel resonator R5 on the substrate (chip) 9-1 and the ground 10-5 next to the outer housing pin 9-4 are obtained given the connection of the parallel branches to ground. These essentially include the inductive part of the stripline on the chip, the inductance of the bond connection 9-9 and that of the housing lead-through 10-3.

These series inductances influence the behavior of the filter both in the passband as well as in the stop band. $f<<f_0$ applies for the pass band. The resonant frequency and, thus, the bandwidth of a resonator can, as known, be modified by an external wiring belonging to the resonator. An inductance serially with the resonator increases the effective dynamic inductance, resulting in a drop in the resonant frequency $f_r$. Since the anti-resonant frequency $f_a$ is shifted to only a very slight extent, the bandwidth $\Delta = f_a - f_r$ of a resonator is increased with the serial inductance. The bandwidth of the SAW filter is also increased in the case of a parallel resonator.

$f << f_0$ and $f >> f_0$ applies for the stop band. Here, the equivalent circuit diagram of a resonator is reduced to its static capacitance $C_0$ since the series resonant circuit is extremely high-impedance beyond $f_0$ and corresponds to a no-load condition. An inductance $L_{ser}$ connected serially with the resonator produces the series resonant circuit shown in FIG. 11b having a resonant frequency.

$$f_{pol} = 1/2\pi\sqrt{L_{ser} * C_0} \qquad (1.5)$$

In the case of an inductance connected serially with a parallel resonator, this means that the energy of the filter can flow off directly to ground given the frequency $f_{pol}$; a "pole point" thus forms in the filter curve, i.e., an increased suppression in the stop band. A plurality of pole points in the stop band corresponds to the plurality of parallel branches with series inductance. Pole points $f_{pol1}$ and $f_{pol2}$ that can be distinguished from one another in terms of frequency derive only given different products $\Pi_1 = L_{ser1} * C_{01}$ and $\Pi_2 = L_{ser2} * C_{02}$. When the products are identical, then the pole points lie at the same frequency; a double pole point $f_{pol} = f_{pol1} = f_{pol2}$ is obtained with a higher suppression than that of a simple single pole point.

FIG. 11b shows the attenuation behavior of a resonator in the parallel branch to which an inductance $L_{ser}$ is serially connected to the output side of the parallel resonator. As in FIG. 11b, the series resonant circuit of the resonator (whose resonant frequency $f_{rp} = F_0$) was removed in order to illustrate the pole point. What typically applies for the frequency of the pole point $f_{pol}$ is $f_{pol} > f_0$, where $f_0$ is equal to the resonant frequency of the filter. A high attenuation is then obtained for the pole point.

Saw filters of the reactance filter type are mainly employed as RF filters in the mobile radio telephone field since they exhibit extremely low losses in the pass band. As and RF filter in the mobile radio telephone field, the SAW filter of the reactance filter type must, over and above this, suppress: first, the duplex band (i.e., the reception band given a transmission filter and, conversely, the transmission band given a reception filter); and, second, the signal at the local oscillator frequency (LO) and/or at the image frequency in order to prevent unwanted mixed products in the telephone.

The local oscillator lies above or below the middle frequency $f_0$ of the filter. The distance from the middle frequency $f_0$ corresponds to the intermediate frequency (ZF) employed for the signal editing. The image frequency has the spacing 2*ZF from the middle frequency $f_0$. Since momentary ZF frequencies in the range of 100–400 MHz are employed, the SAW filter—depending on the application—must comprise good attenuation properties of, typically, more than 30 dB in the range $f_0 \pm 100$–800 MHz. In the most frequent instances, the local oscillator lies above the middle frequency $f_0$.

There are various possibilities for achieving an adequate attenuation in the range of the LO frequency and/or image frequency. According to a first possibility, the general selection level may be made correspondingly high (the minimum attenuation below the pass band given approximately $f_0/2$ is valid as a criterion for this). The great disadvantage in this situation is, however, that the losses in the pass band also increase with an increasing selection level. This is unacceptable for the signal processing in the telephone in most cases.

The second possibility is based on the previously mentioned fact that an inductance present for the traditional structuring technique generates a pole point serially with a parallel resonator that lies exactly at the LO or image frequency. Given the great spectrum of ZF frequencies employed, a possibility must be established in this case in order to vary the generated pole point over a range of approximately 700 MHz.

Since the static capacitance $C_{0p}$ in the parallel branch is the determining factor for the filter performance (passband, matching and selection level), the pole point can only be varied to an extremely slight degree with given filter demands such that the position of pole points in the stop band also simultaneously changes.

Likewise, the degree of freedom for the size of the inductance serially between output side of the parallel resonator and ground is limited. The inductive part of the stripline on the chip can be varied to only a limited extent, due to the necessity for miniaturization as well as for cost reasons, the chips that are employed are becoming smaller and smaller. The length and the inductance of the associated bond connection can likewise hardly to be varied any more with any housing in the course of the progressing trend towards miniaturization. Moreover, the inductance that derives from the housing lead-through a fixed for a given housing.

This second possibility is thus also not established anymore to an adequate extent for SAW filters according to the reactance filter type in housings that have been miniaturized further. This possibility is no longer established to an adequate degree in order to assure the LO and/or image suppression via suitably placed pole points over a great frequency range from $f_0$ plus 100–800 MHz.

It is impossible to generate pole points at relatively low frequencies (i.e., in the range of 100 MHz above the middle frequency $f_0$), particularly given the future connection technology of "flip-chip-technique" in which bump connections are employed instead of the bond wires, since the inductances present given this structuring technique serially to the output side of a parallel resonator are too small (see Equation 1.5), and the static capacitances of the parallel branches can likewise not be selected great enough because of the required self-matching to 50 Ω.

SUMMARY OF THE INVENTION

It is therefore an object of the present invention to provide a way of designing a filter such that an improved stop band suppression can be obtained for specific LO frequencies and image frequencies over a possible range from 100 through 800 MHz next to the middle frequency. In particular, a way is provided for shifting pole points of a reactance filter into a desired region close to the middle frequency $f_0$ without greatly influencing the remaining filter behavior.

This object is achieved by a surface-active wave (SAW) filter of a reactance filter type, comprising a first SAW resonator in a parallel branch of the filter that has a static capacitance; a further first SAW resonator in a further parallel branch of the filter that has a static capacitance; a second SAW resonator in a serial branch of the filter that has a static capacitance; at least one basic element fashioned on a piezoelectric substrate, the basic element comprising the first SAW resonator and the second SAW resonator; an electrical connection of ground sides of the first SAW resonator and of the further first SAW resonator (collectively, two first resonators), the electrical connection of the ground sides configured to be made before bonding to a housing that contains the filter; and a bump connection on a housing link of the two electrically connected ground sides of the two first resonators; wherein at least the static capacitance of the first SAW resonator and the static capacitance of the further first saw resonator differ from one another.

This object is also achieved by a method for manufacturing this SAW filter, comprising shifting a pole point in the SAW filter; raising or lowering the static capacitance of at least one of the first SAW resonator and the further first SAW resonator; and raising or lowering a static capacitance of one or more further, non-coupled first resonators such that an overall sum of the static capacitances of all parallel resonators remains identical.

A coupling of the parallel branches is inventively produced as a result of a connection of the ground-side output sides of the parallel branches respectively comprising a resonator on the chip. This permits a greatly modifiable frequency positioning of the appertaining pole point (also referred to as "coupled pole point" below).

As a result, it is possible to produce a SAW filter that comprises pole points at lower frequencies that could be achieved by the previous, serial interconnection of the parallel branches with existing, structure-conditioned inductances according to Equation (1.5). It is also possible to shift one or more pole points in a given filter over a broader frequency range than was previously possible in a given filter. With the invention, thus, a pole point can be generated at exactly the frequency at which a high selection is required, for example, at an arbitrary LO or image frequency.

Such demands for the suppression of signals at the local oscillator frequency (LO suppression) and/or at the image frequency (image suppression) can thus still be satisfied in extremely small housing having very low structure-conditioned inductances. One or more pole points can be shifted to a desired frequency given an established bond inductance, conduct inductance or housing lead-through inductance without this requiring an increase in the serial inductance. Additionally, of course, the serial inductance can also be increased.

Moreover, the plurality of ground connections that are offered can be set independently of the plurality of parallel branches employed, this leading to a lower space requirement. It is precisely in view of new connecting technologies (bump connections instead of bond connections) and new housing technologies that the embodiments according to the invention represent the sole possibility for achieving the previously mentioned selection demands in miniaturized housings.

The principle for shifting the pole points according to the present invention is explained in greater detail below on the basis of exemplary embodiments and the appertaining figures. The following, concrete embodiments are examples of the employment in a SAW filter of the reactance filter type.

DETAILED DESCRIPTION OF THE INVENTION

Figure 12:
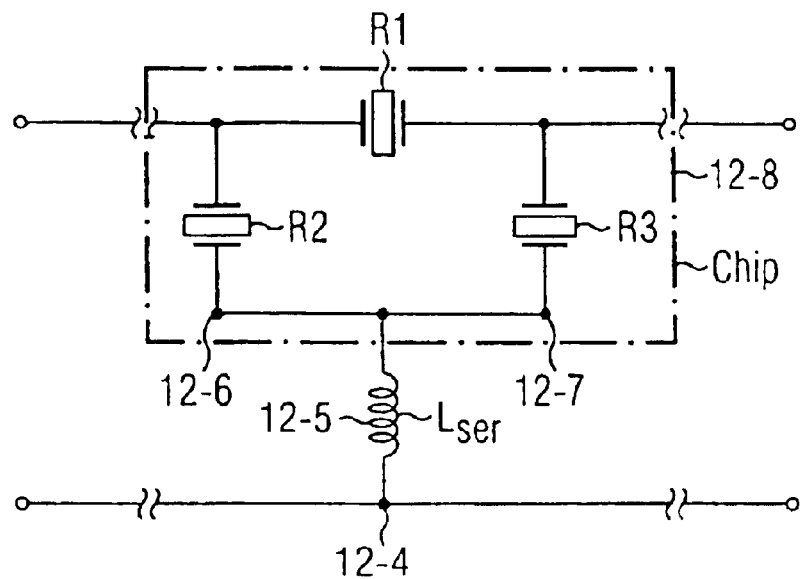
FIG. 12 is an equivalent circuit diagram of an inventive filter.

FIG. 12 shows a simple filter structure of the invention symbolically as an equivalent circuit diagram, which may be part of a larger filter structure with further basic elements. For a filter circuit having (at least) two of the parallel branches with the parallel resonators R2 and R3, the output sides 12-6 and 12-7 are already inventively electrically connected to one another on the chip itself (substrate) 12-8. Only after such a connection is present does one make a connection to the housing ground pad 12-4 comprising, for example, a bond connection 12-5.

Figure 13:
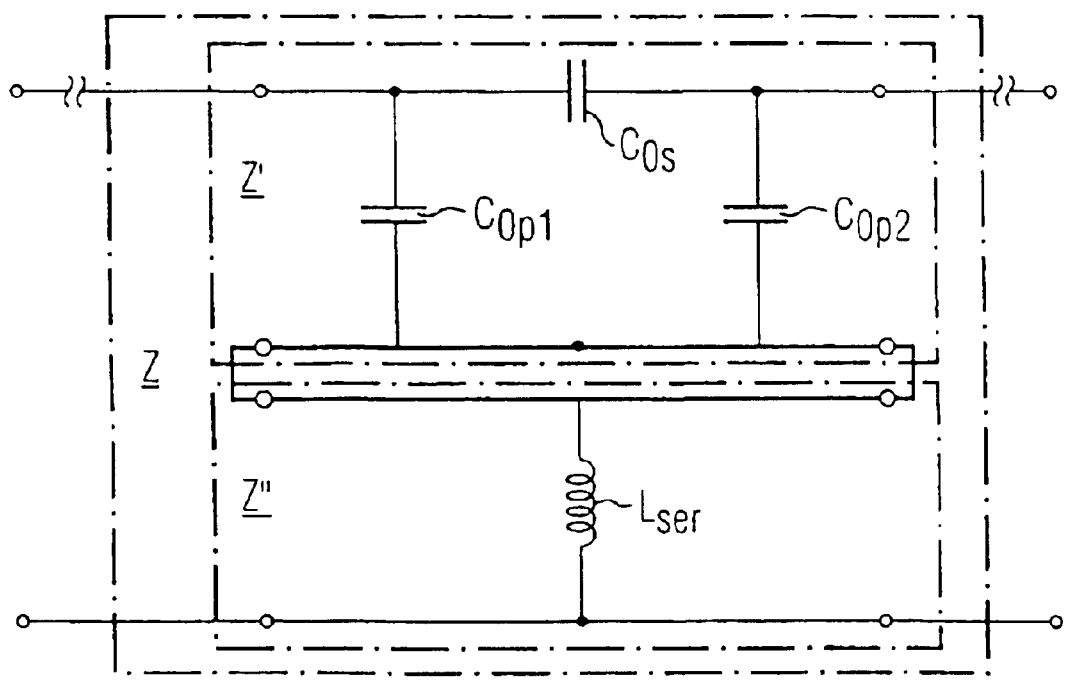
FIG. 13 is an equivalent circuit diagram for the attenuation behavior of a SAW filter.

FIG. 13 shows the equivalent circuit diagram for the frequency range $f \ll f_0$ and $f \gg f_0$ where only the static capacitance $C_0$ takes effect for each resonator. The selection behavior of a SAW filter according to the reactance filter type can be largely described with this reduced equivalent circuit diagram. The inductance $L_{ser}$ corresponds to the inductance between the connection of the parallel resonators on the chip and the housing ground pin (equals terminal for ground at the housing) outside.

The coupling of the two parallel branches already electrically connected on the chip that occurs leads to a frequency position change of the pole points in the stop band. The frequency position of the coupled pole point can be identified based on the equivalent circuit diagram from FIG. 13 which shows a two port circuit Z. The two port circuit Z comprises a pole point when the impedance to ground becomes zero.

$$Z_{21}=0$$

where $Z_{21}$ is a systematically referenced matrix element from the impedance matrix. For determining $Z_{21}$, the two port circuit Z can be divided into a series circuit of the two-ports Z' and Z''. The two-port Z' comprises the Π-circuit composed of the three capacitors $C_{op1}$, $C_{op2}$ and $C_{os}$. The two-port Z'' comprises only the inductance $L_{ser}$. The following thus derives:

$$Z'_{21} = \frac{1}{j\omega\left(C_{0p2}C_{0p1} + \frac{C_{0p1}C_{0p2}}{C_{0s}}\right)} \quad (2.1)$$

$$Z''_{21} = j\omega L_{ser} \quad (2.2)$$

Where j represents the imaginary number and $\omega=2\pi f$ applies.

With $$Z_{21}=Z'_{21}+Z''_{21} \quad (2.3)$$

it follows that $$Z_{21} = \frac{1 - \omega^2 L_{ser}\left(C_{0p2} + C_{0p1} + \frac{C_{0p1}C_{0p2}}{C_{0s}}\right)}{j\omega\left(C_{0p2} + C_{0p1} + \frac{C_{0p1}C_{0p2}}{C_{0s}}\right)} \quad (2.4)$$

When the numerator of the expression of (2.4) becomes zero, $$1 - \omega^2 L_{ser}\left(C_{0p2} + C_{0p1} + \frac{C_{0p1}C_{0p2}}{C_{0s}}\right) = 0 \quad (2.5)$$

$Z_{21}$ becomes zero. The following derives for the frequency position of the coupled pole point:

$$f_{pol(coupled)} = \frac{1}{2\pi\sqrt{L_{ser}\left(C_{0p2} + C_{0p1} + \frac{C_{0p1}C_{0p2}}{C_{0s}}\right)}} \quad (2.6)$$

It can be clearly seen compared to the pole points previously obtained without coupling of the parallel branches on the chip according to Equation (1.5).

$$(2.7) \quad f_{pol2}\frac{1}{2\pi}\sqrt{L_{ser} * C_{op2}} \quad (2.8)$$

That the additional capacitance parts $$\frac{C_{op1}C_{op2}}{C_{os}}$$

and $C_{op2}$ or $C_{op1}$ shift the coupled pole point to a far lower frequency given the same inductance $L_{ser}$.

To illustrate with a numerical example: for a known SAW filter of the reactance filter type, the frequency $f_{pol}$ of a pole point is calculated as:

$$f_{pol}1 = \frac{1}{2\pi}\sqrt{L_{ser} \cdot C_{op1}} = \frac{1}{2\pi}\sqrt{1nH \cdot 4pF} = 2.52 \text{ GHz}$$

Typical values of 1nH and 4pF are assumed in this example for the serial inductance $L_{ser}$ and for the static capacitance $C_{op}$.

According to Equation 2.6 and given the same assumed values for $L_{ser}$ and $C_{0p}$ and likewise given 4pF for $C_{0s}$, $$f_{pol}2 = \frac{1}{2\pi}\sqrt{1nH * (rpF + 4pF + (4pF)^2/4pF)} = 1.45 \text{ GHz}$$

derives when two parallel branches are coupled.

When a filter comprises a plurality of parallel branches, then a plurality of parallel branches can also be connected to one another at the ground side, these are also referred to as "coupled parallel branches". The plurality and combination of the connected parallel branches plays a critical part for the frequency position of the coupled pole points and is considered in the selection of the filter structure for a desired frequency position of the pole points.

Figure 14:
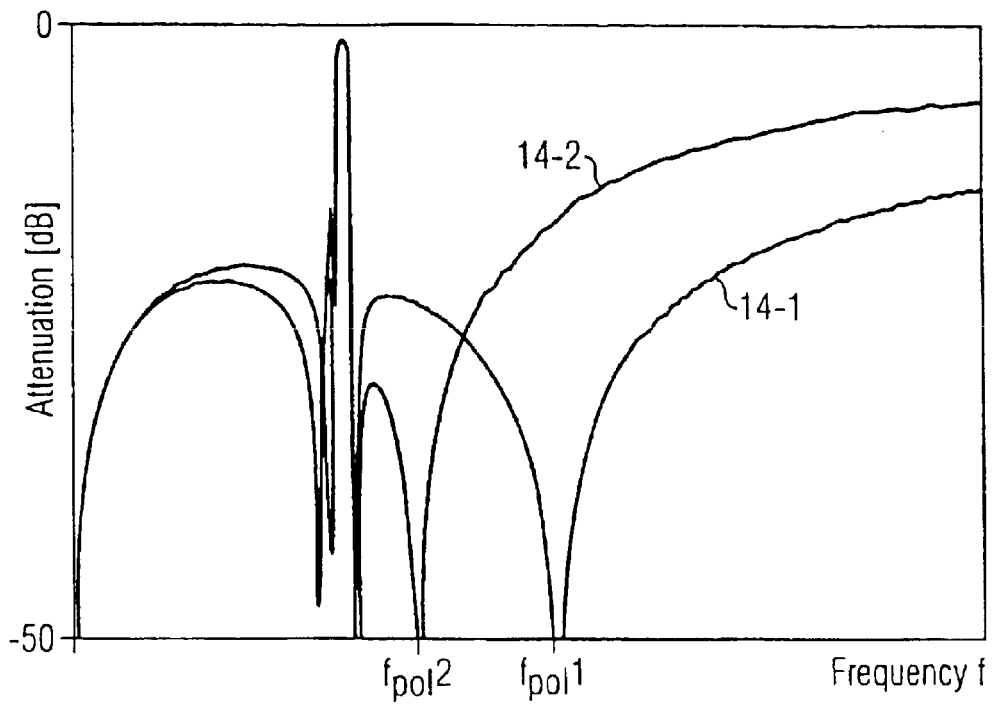
FIG. 14 is a graph showing the relationship between $\Delta L_{ser}$ and the pole point.

FIG. 14 indicates the dependency of the position of a coupled pole point on the size of the inductance $L_{ser}$. The two curves 14-1 and 14-2 indicate the filter behavior for the same filter, where only $L_{ser}$ has been differently selected. A different frequency position of the pole points derives dependent on $L_{ser}$, where the inductance $L_{ser}$ 1 belonging to $f_{pol}$ 1 is smaller than $L_{ser}$ 2. The shift of the pole points toward lower frequencies is greater the higher the inductance $L_{ser}$ is.

To a lesser extent, the frequency position of the pole point can be set by a variation of the product of static capacitances of the coupled parallel branches $$\Pi_p C = C_{0p1} * C_{0p2} \quad (2.9)$$

So that the filter behavior in the passband and the general selection level is not modified, such a variation of the product of static capacitances in the parallel branch can be implemented only upon retention of their sum:

$$\Sigma C_p = C_{0p1} + C_{0p2} = \text{constant} \quad (2.10)$$

The following method can be applied: the static capacitance $C_{op1}$ of the first coupled parallel resonator is increased by the same amount $C_{const}$ $$C_{0p1}(\text{new}) = C_{0p1} + C_{const} \quad (2.11)$$

by which the static capacitance $C_{0p2}$ of the second couple parallel resonator is lowered:

$$C_{op2}(\text{new}) = C_{0p2} - C_{const} \text{ with } C_{const} < C_{0p2}, \quad (2.12)$$

so that the product $\Sigma C_p$ in fact changes but the sum of the static capacitances remains identical.

$$\Sigma C_p = C_{0p1}(\text{new}) + C_{0p2}(\text{new}) = C_{0p1} + C_{0p2} = \text{constant} \quad (2.13)$$

and no modifications of the passband or of the general selection level need be accepted.

When a greater frequency offset of the coupled pole point is necessary, the participating static capacitances $C_{0p1}$, $C_{0p2}$ or $C_0$, can be varied. When more parallel resonators than the two parallel resonators to be coupled are present, then the sum $C_{0p1} + C_{0p2}$ can be raised (or lowered), and the static capacitance of a non-coupled parallel resonator can be lowered (or raised) for balancing such that the total sum of all static capacitances remains the same in the parallel branches, thus retaining the general selection level.

Figure 15:
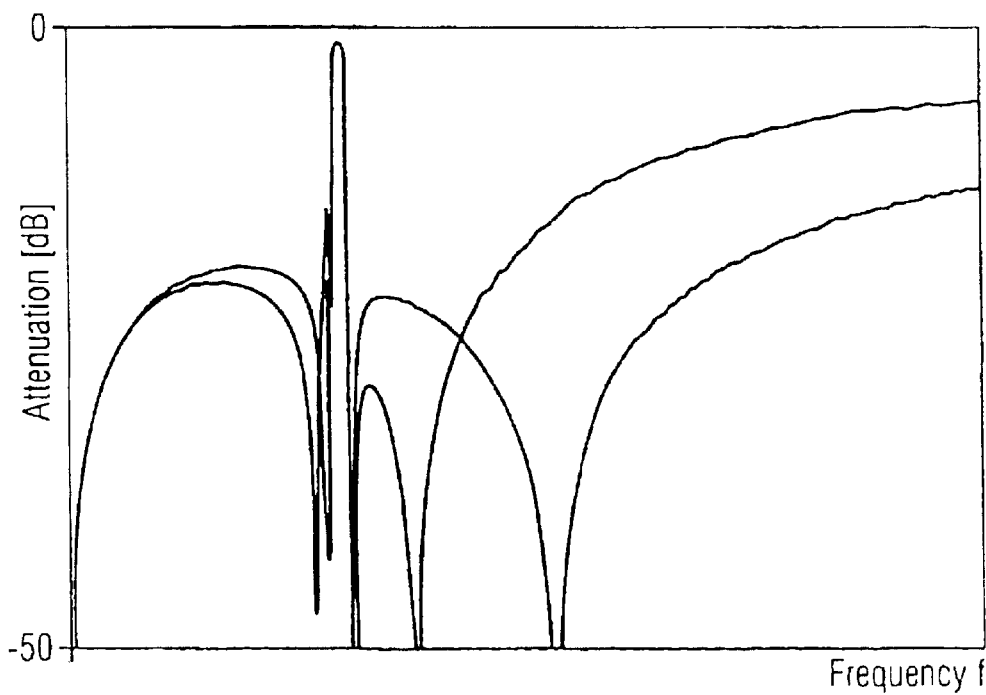
FIG. 15 is a graph showing the dependency of the frequency position of the pole point on the static capacitance.

FIG. 15 shows how, given a constant inductance $L_{ser}$, the frequency of the coupled pole point is increased as a result of a reduction of the sum of the static capacitances $C_{0p1} + C_{0p2}$ of the coupled parallel branches being increased by the factor 1.2. For balancing, the static capacitance of a further parallel branch is correspondingly increased.

Another possibility for shifting the coupled pole point is to intentionally split a parallel resonator P into two individual resonators P' and P" parallel to one another, where the sum of the capacitances of the split, individual resonators is equal to the original capacitances $C_{0p}$:

$$C_{0p} = C'_{0p} + C''_{0p}.$$

When one of these parallel resonators P' is coupled with a further parallel resonator, but not with the parallel resonator P", then the frequency position of the coupled pole point can be set on the basis of the division ratio $$\frac{C'_{\theta p}}{C''_{\theta p}}$$

of the static capacitance of the split parallel resonators P' and P", since $C'_{0p}$ influences the frequency position of the coupled pole point.

A single series resonator or a plurality of series resonators can be arranged between coupled parallel branches. Since the size of the static capacitance $C_{0s}$ that lies between the coupled parallel resonators influences the frequency position of the coupled pole point according to Equation 2.6, the frequency position of the coupled pole point can likewise be shifted with the following method.

When further series resonators $S_n$ are present, in addition to the series resonator or resonators S lying between the coupled parallel branches, then the static capacitance $C_{0s}$ can be raised (or lowered). Additionally, for balancing, the static capacitance of the series resonators $S_n$ that do not lie between the coupled parallel resonators can be lowered (or raised) such that the total sum of all static capacitances in the series branches remains the same. This results in retaining the general selection level and modifying the frequency position of the coupled pole point.

The range for a variation of the static capacitances $C_p$ in the parallel branch and of the serial inductances $L_{ser}$ (between the connection of the parallel branch on the chip and the outside terminal at the housing) is limited. The same is therefore also true for the frequency range in which the pole points can be displayed. In contrast to the measures known from the prior art, however, the range of variation achieved according to the invention enables the manufacture of SAW filters—even given extremely miniaturized housings—with an LO suppression and image suspension that is required for the employment as an RF filter in the mobile radio telephone field.

Concrete embodiments of inventive filters described below.

FIRST EMBODIMENT

Figure 16:
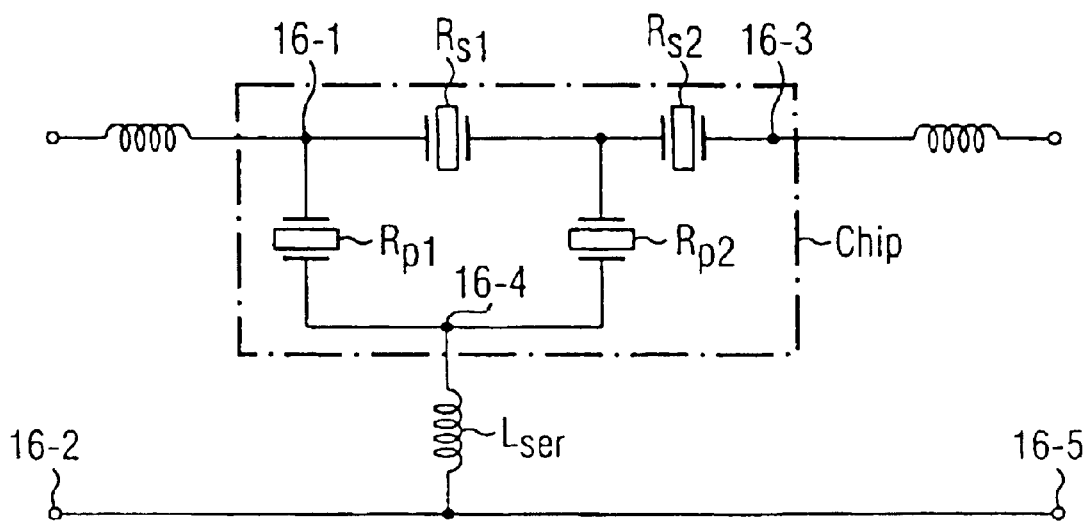
FIG. 16 is a schematic diagram of a first embodiment of a filter having three basic elements.
Figure 17:
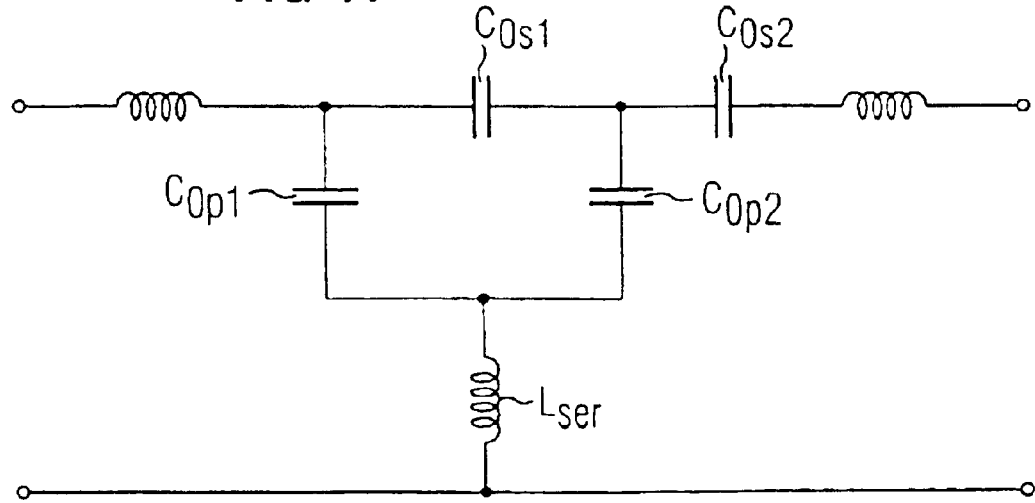
FIG. 17 is an equivalent circuit diagram of the first embodiment circuit shown in FIG. 16 in the stop band.
Figure 18:
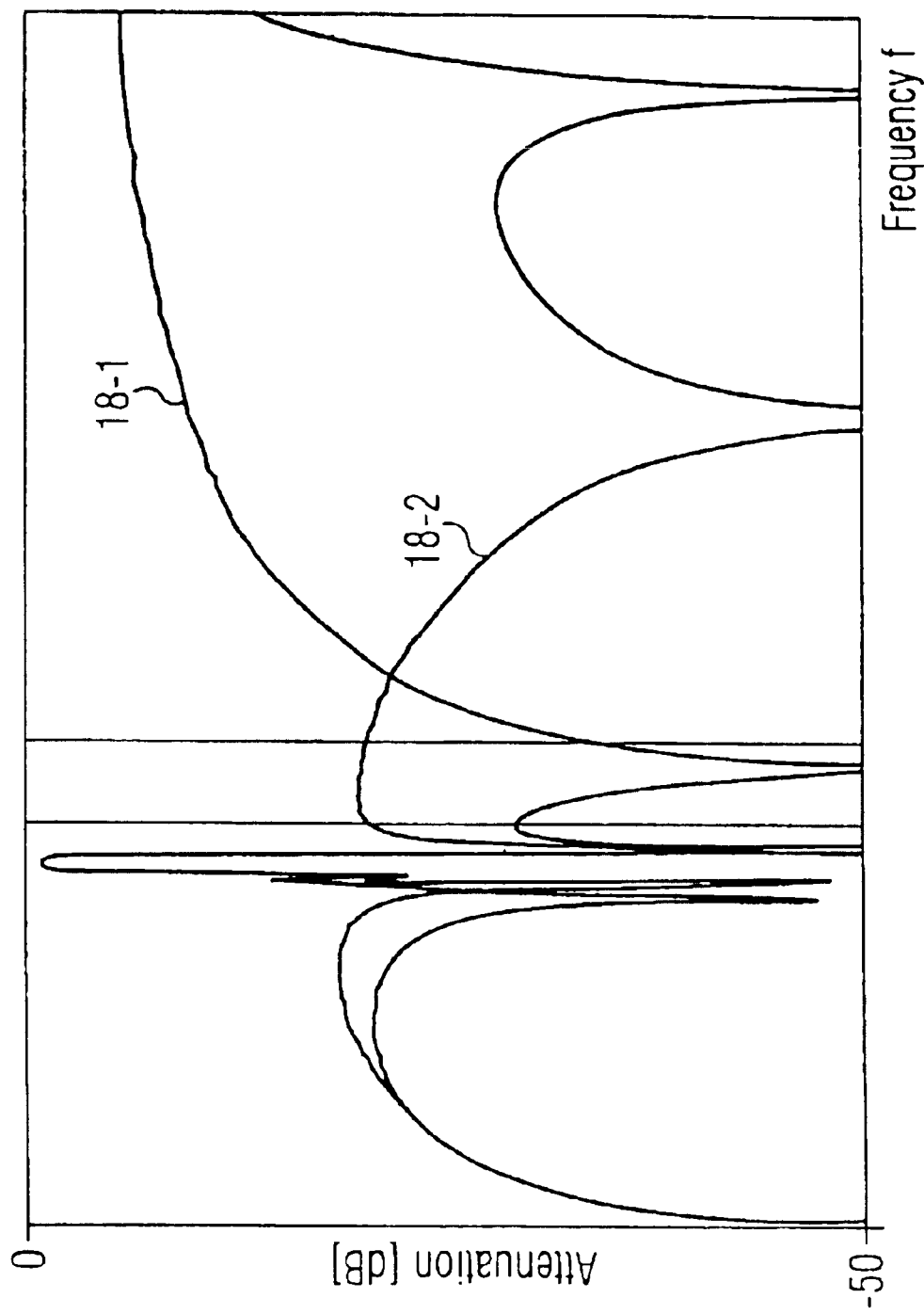
FIG. 18 is a graph illustrating the attenuation behavior of the first embodiment circuit shown in FIG. 16.

A first embodiment (Embodiment 1) of the invention, illustrated in FIGS. 16–18, uses a structure having three basic elements. A first basic element is connected to the input port 16-1 such that both the parallel branch as well as the series branch comprise a connection to the input port. The second basic element is connected according to the matching demand $Z_{out} = Z_{in}$. The third basic element follows in the same way. Differing from the case at the input port, only one series branch is thus directly connected to the output port. A sequence p-s - s-p - p-s for the resonators is present from the input to the output, where p stands for parallel resonator and s stands for series resonator. Fundamentally, the input port and output port can be interchanged without modifying the filter properties, from which the sequence presented is s-p - p-s- s-p.

As is known in the art, identical resonators can also be combined upon retention of their capacitance. The following structures with a minimum number of resonators thus derive:

p-s-p-s or s-p-s-p however, mixed forms having partial combination of the resonators area also possible:

p-s-pp-s or s-p-p-s-p p-s-s-p-s or s-p-s-s-p

For the sake of simplicity, the embodiments below are only explained on the basis of a minimum of resonators and without additional indication of the interchangeability of the input port and the output port, and are shown this way in the Figures. Nonetheless, the invention also comprises modifications according to the above example.

FIG. 16 symbolically shows the structure of Embodiment 1. The two parallel branches are already electrically connected to one another on the chip and a connection to the housing only ensues subsequently in the fabrication. The equivalent circuit diagram for the selection behavior in the range $f<<f_0$ and $f>>f_0$ is shown in FIG. 17. The inductance $L_{ser}$ corresponds to an inductance between the connection of the parallel resonators on the chip and the housing ground pin outside.

Figure 1:
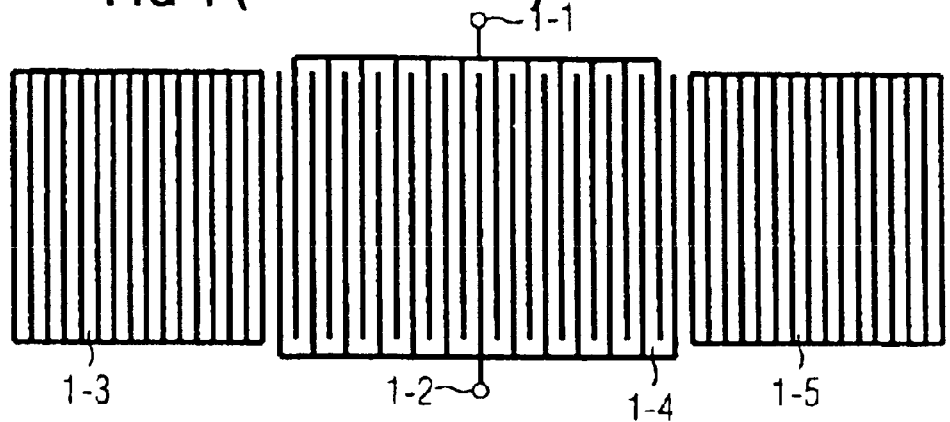
FIG. 1 is a pictorial diagram of a one-port SAW resonator.
Figure 2:
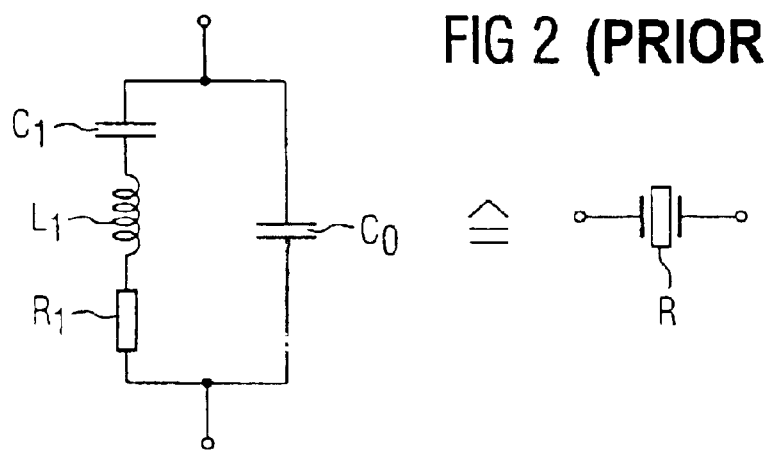
FIG. 2 is the equivalent circuit diagram and symbol for a SAW resonator.
Figure 3:
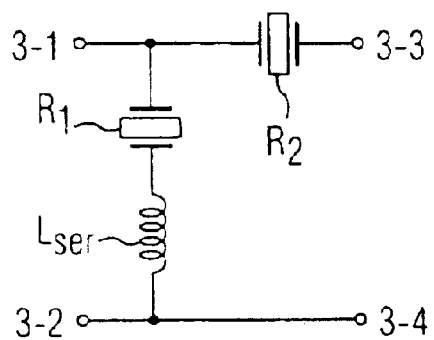
FIG. 3 is a schematic diagram showing a basic element of a SAW filter of reactance filter type.
Figure 4:
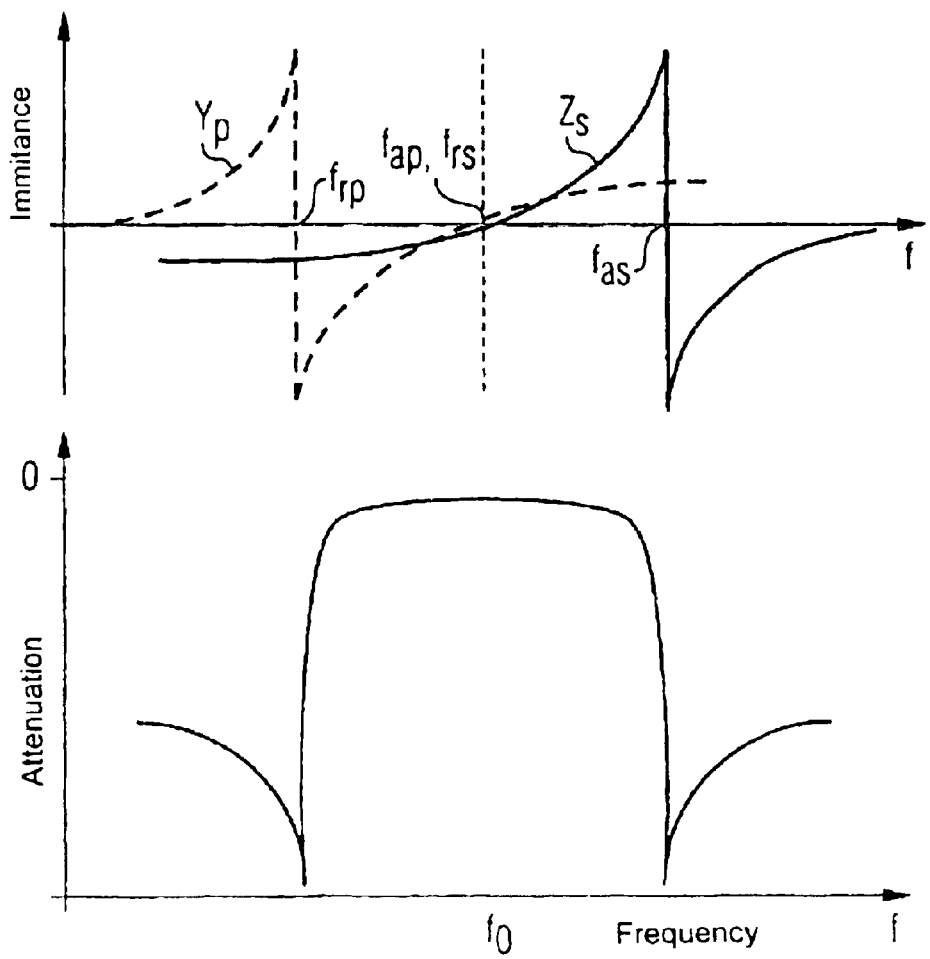
FIG. 4 is a graph illustrating the interaction of parallel and series resonators.
Figure 5:
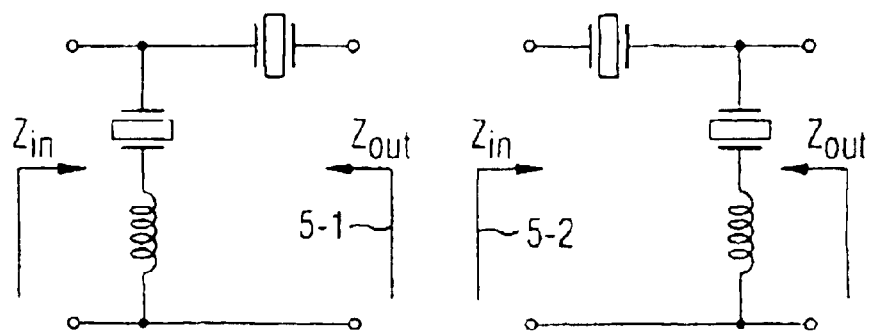
FIG. 5 is a schematic diagram showing a cascade of two basic elements.
Figure 6:
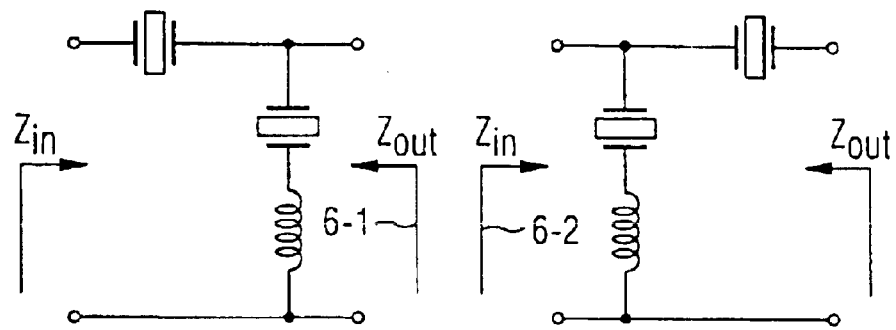
FIG. 6 is a schematic diagram showing a cascade of two basic elements.
Figure 7:
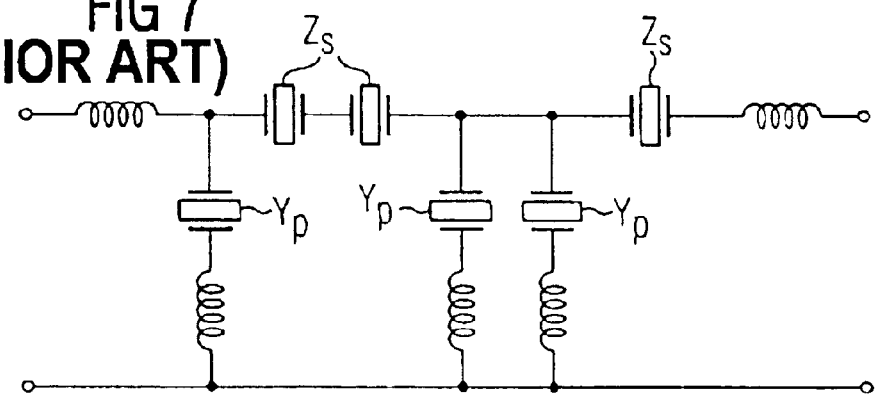
FIG. 7 is a schematic diagram of a reactance filter.
Figure 8:
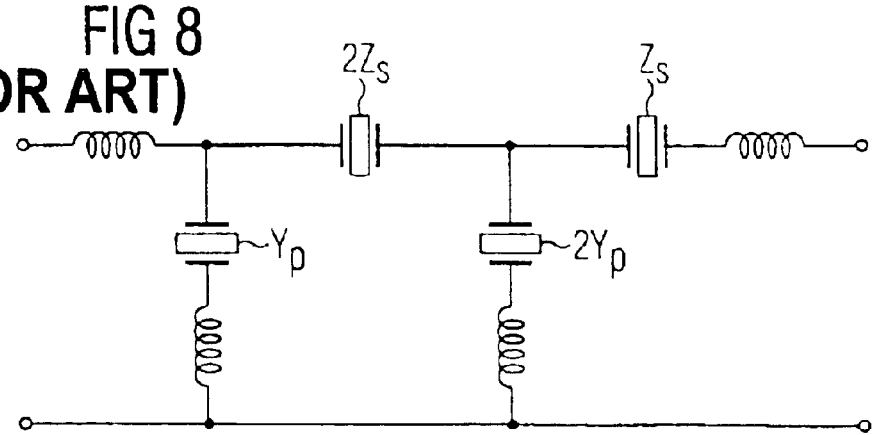
FIG. 8 is a schematic diagram of a reactance filter with the reduced structure s-p-s-p.
Figure 9:
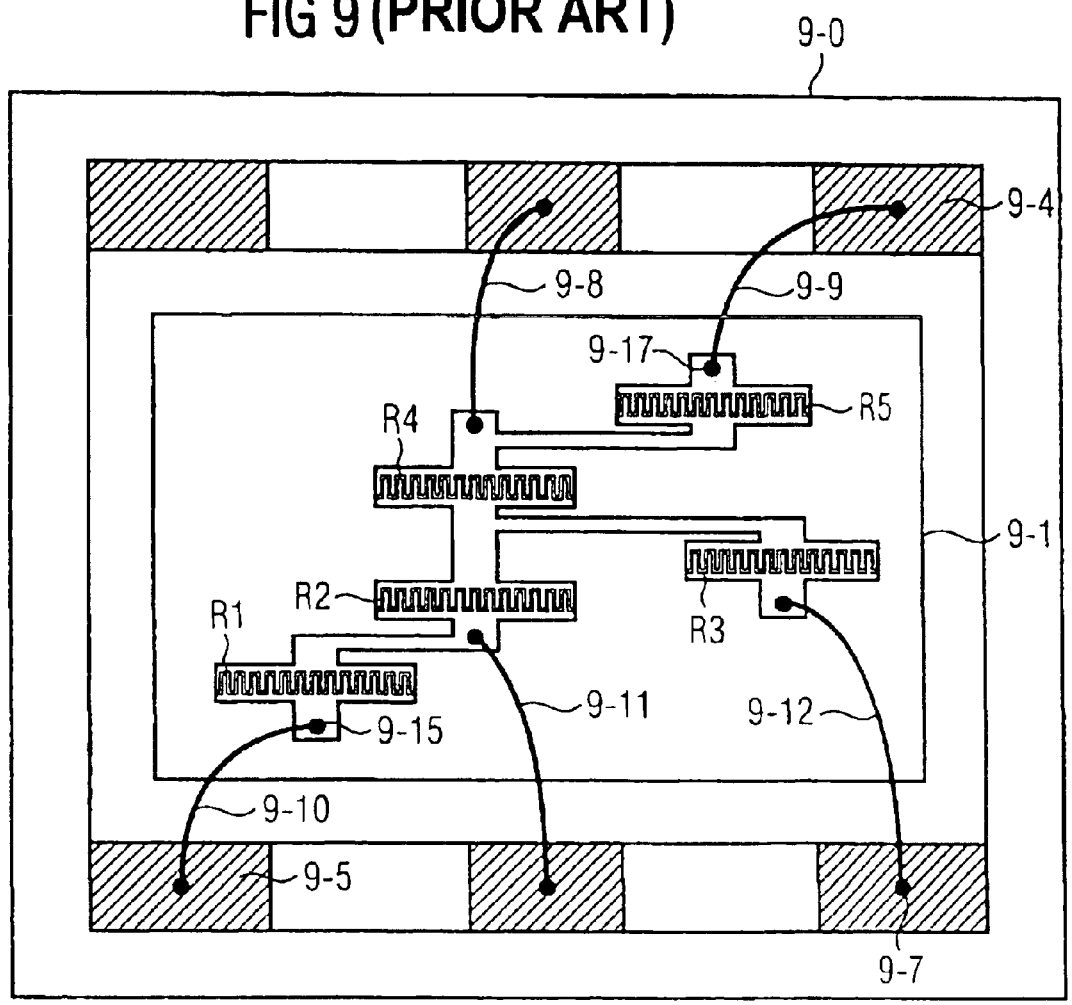
FIG. 9 is a plan view of a SAW filter into the housing without cover.
Figure 10:
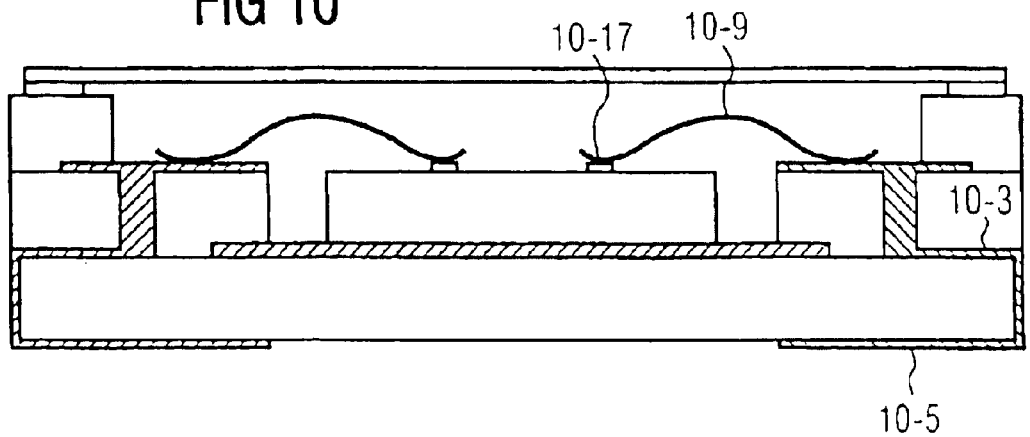
FIG. 10 is a cross-section view through a SAW filter in the housing.
Figure 11A:
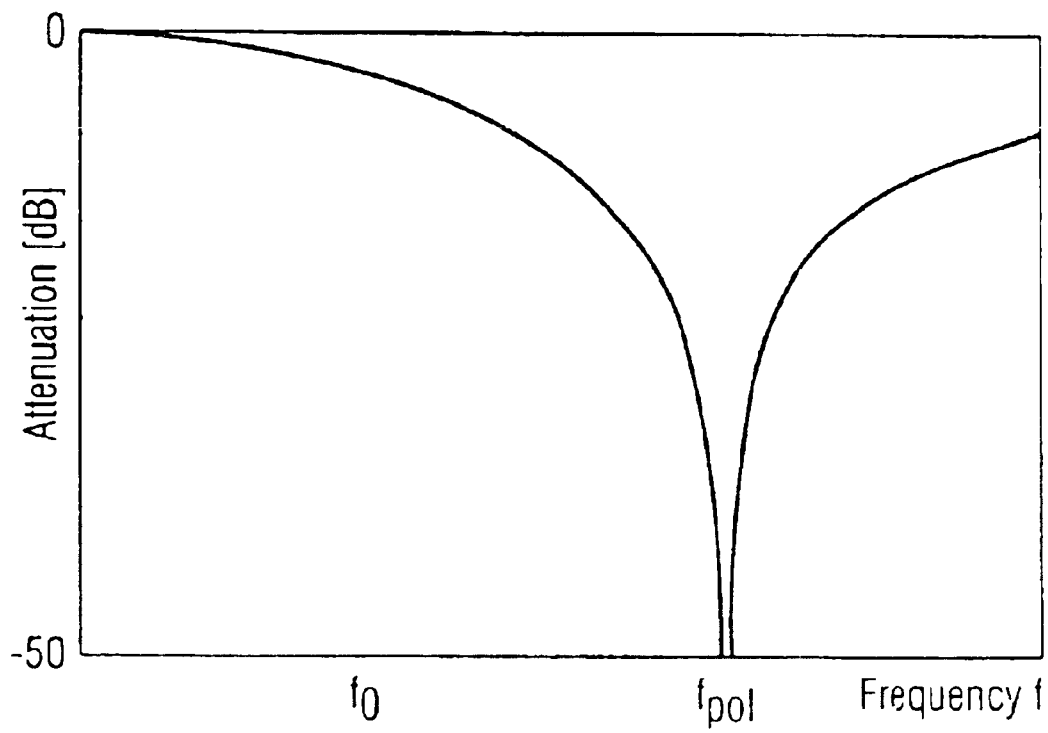
FIG. 11a is a graph illustrating the pole point.
Figure 11B:
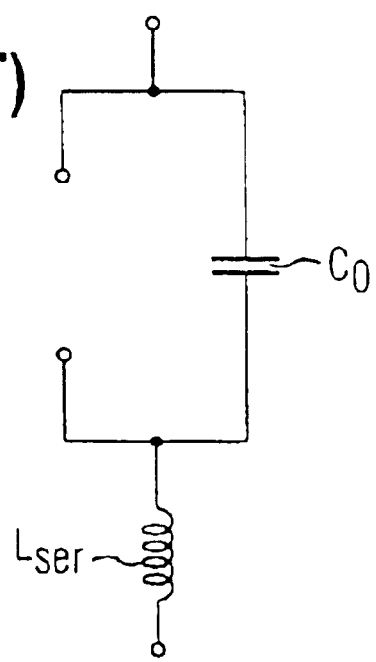
FIG. 11b is an equivalent circuit diagram for the attenuation behavior of a parallel branch.

The filter has a filter characteristic as identified by curve 18-1 in FIG. 18. The comparison to filter curve 18-2 (corresponding to the filter shown in FIG. 8) in which the parallel branches on the chip are not connected to one another, clearly shows how the frequency position of the pole points in the stop band with a typical inductance $L_{ser} = 1.0$ nH is shifted by the connection of the parallel branches on the chip. The selection is increased by more than 10 dB in the frequency range between the vertical lines (typical frequency range for LO suppression and image suppression given low intermediate frequency).

SECOND EMBODIMENT

Figure 19:
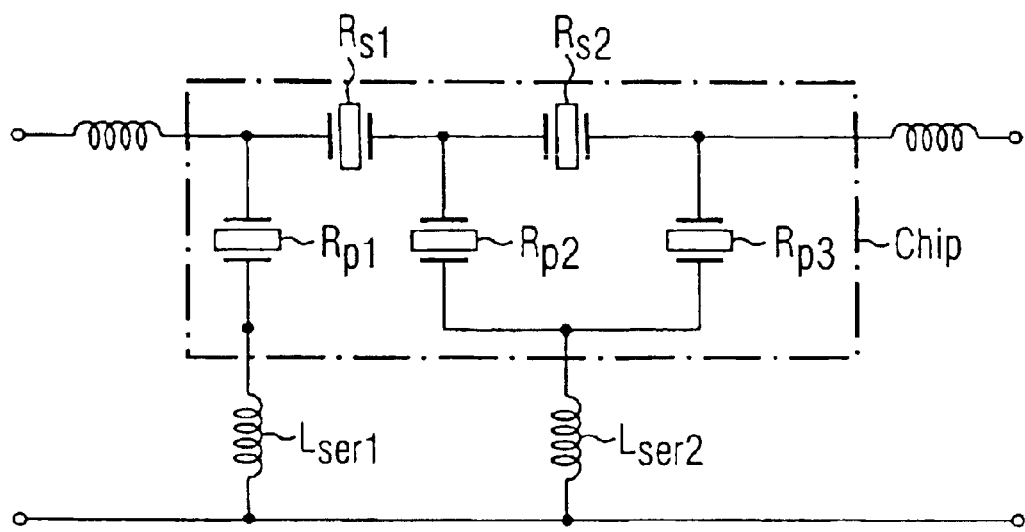
FIG. 19 is a schematic diagram of a second embodiment of a filter with four basic elements.
Figure 20:
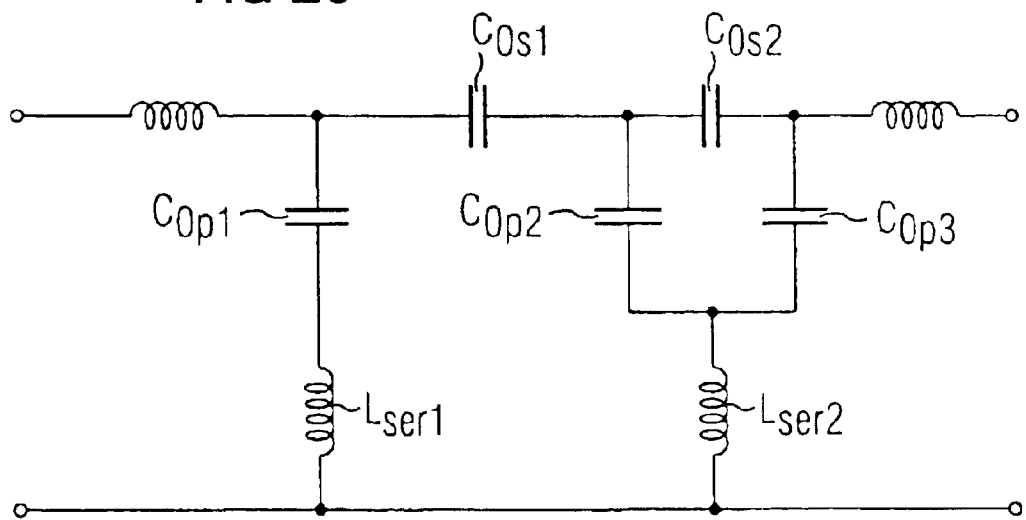
FIG. 20 is a equivalent circuit diagram of the second embodiment circuit shown in FIG. 19 in the stop band.
Figure 21:
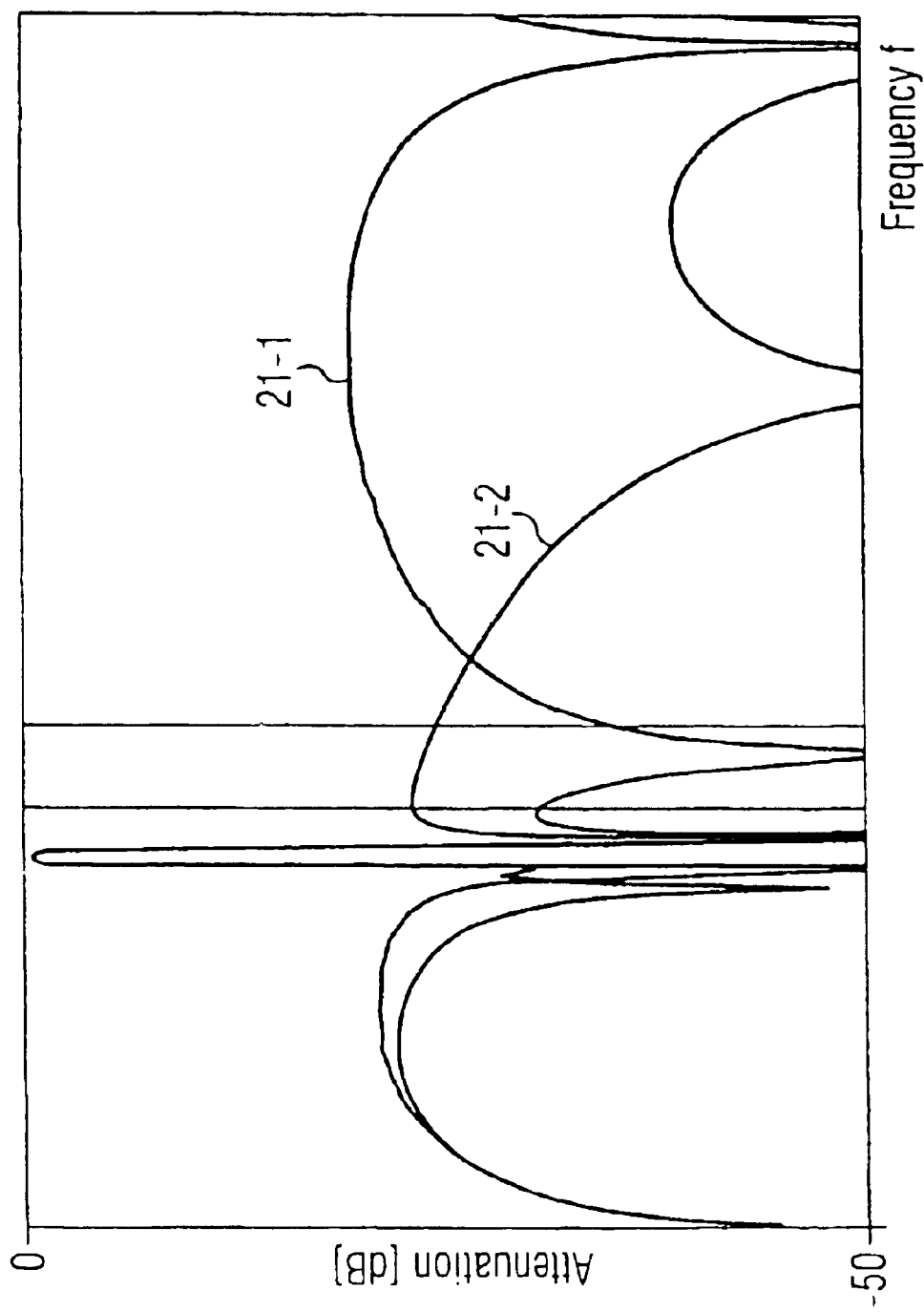
FIG. 21 is a graph illustrating the attenuation behavior of the second embodiment circuit shown in FIG. 19.

A second embodiment (Embodiment 2) is illustrated in FIGS. 19–21. FIG. 19 symbolically shows the structure of the second inventive embodiment in which a structure having four basic elements is employed. A first basic element is connected to the input port 19-1 such that both the parallel branch as well as the series branch comprise a connection to the input port. The second basic element is connected according to the matching requirement $Z_{out} = Z_{in}$. Basic element 3,4 follows in the same way. Just as at the input port, both a parallel branch as well as a series branch are directly connected to the output port 19-3. A sequence for the resonators from the input to the output derives as follows:

p-s-p-s-p where p stands for parallel resonator and s stands for series resonator. Resonators of the same type are already combined.

Two of the three parallel branches are already electrically connected to one another on the chip and a connection to the housing only occurs subsequently via the inductance $L_{ser2}$. The remaining parallel branch is connected to the housing independently via the inductance $L_{ser1}$. The equivalent circuit diagram for the selection behavior in the range $f<<f_0$ and $f>>f_0$ is shown in FIG. 20. The inductance $L_{ser2}$ corresponds to an inductance between the connection 19-4 of the parallel resonators on the chip (shown with the broken line in FIG. 19) and the housing ground pin outside.

In FIG. 21, the curve 21-1 shows the filter characteristic of the filter from FIG. 19. The comparison with the filter curve 21-2 in which the parallel branches are not connected on the chip clearly shows how the frequency position of the pole points in the stop band, given a typical inductance $L_{ser2}=1.0$ nH, is shifted towards lower frequencies due to the connection of two of the three parallel branches on the chip. The selection is increased by approximately 10 dB in the frequency range between the vertical lines (the typical frequency range for LO suppression and image suppression at a low intermediate frequency).

THIRD EMBODIMENT

Figure 22:
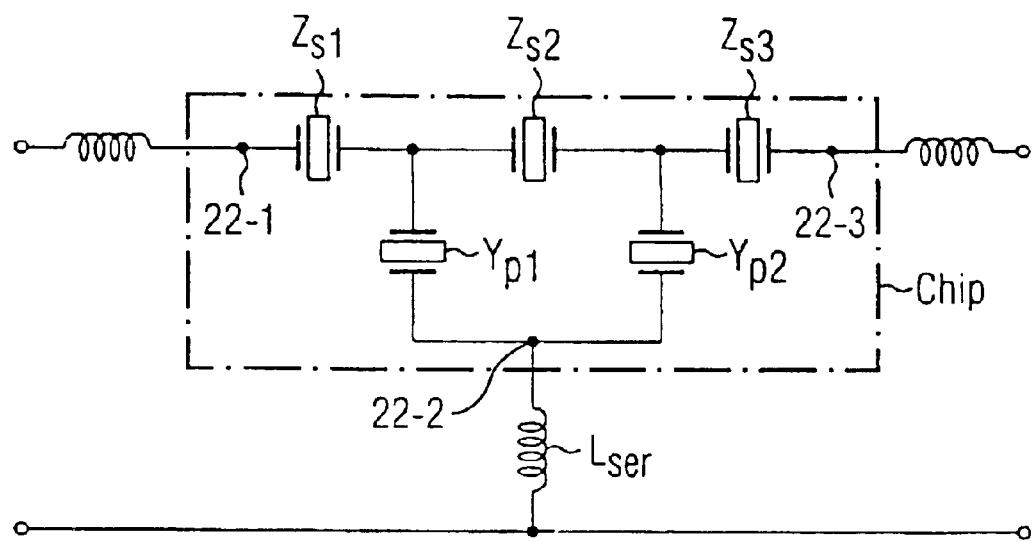
FIG. 22 is a schematic diagram of a third alternative embodiment of a filter with four basic elements.
Figure 23:
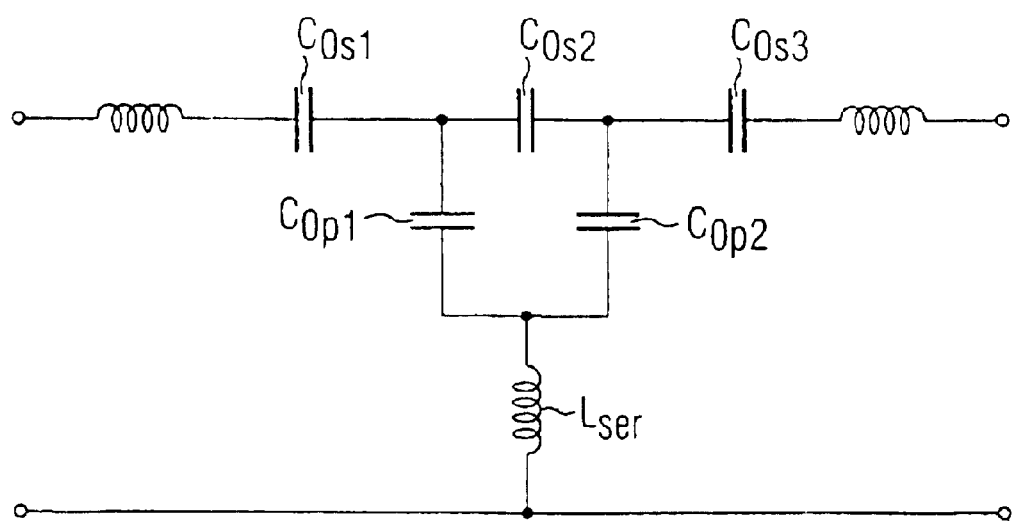
FIG. 23 is an equivalent circuit diagram of the third embodiment circuit shown in FIG. 22 in the stop band.
Figure 24:
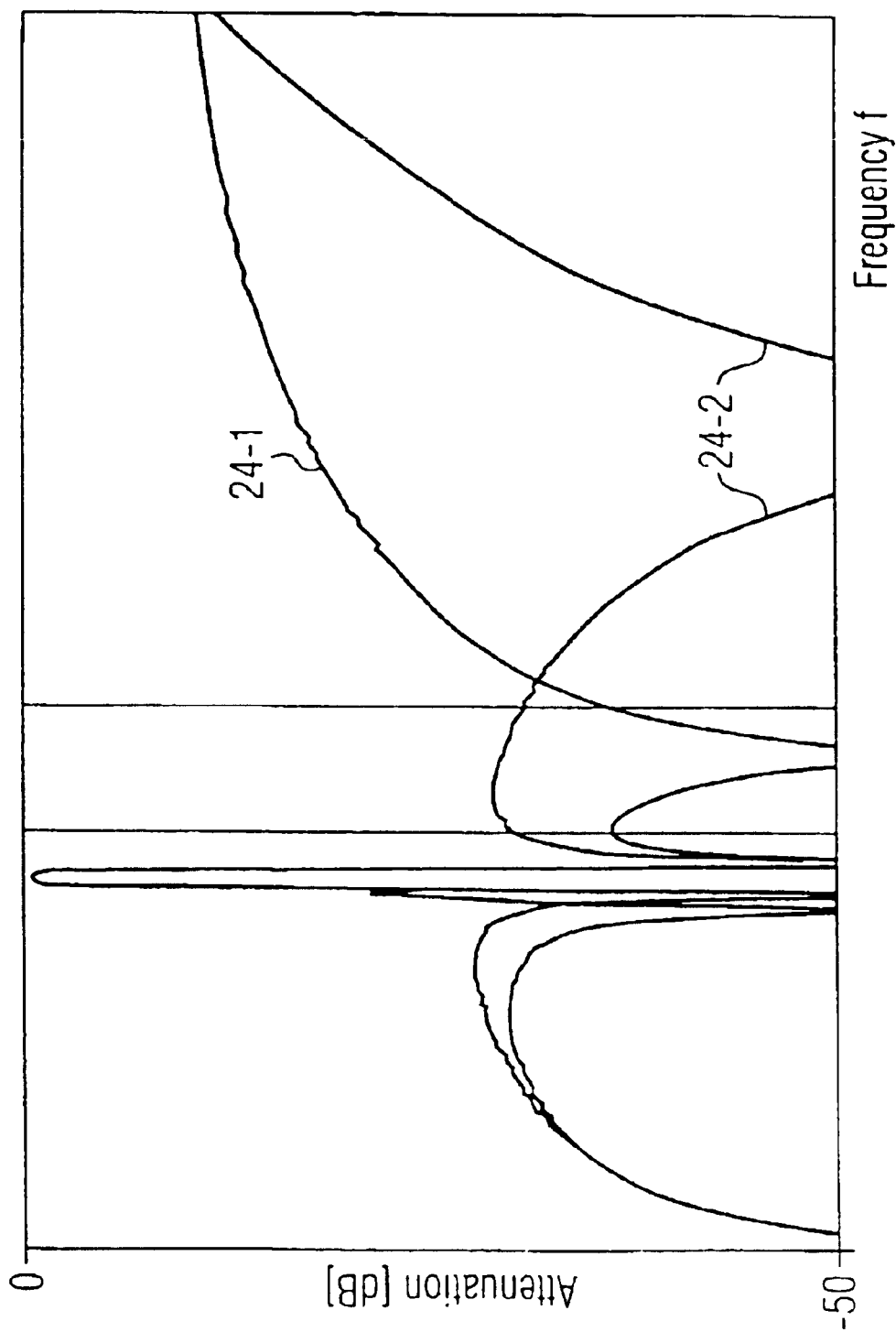
FIG. 24 is a graph illustrating the attenuation behavior of the third embodiment circuit shown in FIG. 22.

A third embodiment (Embodiment 3) is illustrated in FIGS. 22–24. FIG. 22 symbolically shows the structure of the inventive Embodiment 3 in which a structure having three basic elements is employed. A first basic element is connected to the input port 22-1 such that only the series branch comprises a connection to the input port. The second basic element is connected according to the matching requirement $Z_{out}=Z_{in}$. Basic element 3, 4 follows in the same way. Just as at the input port, only one series branch is thus directly connected to the output port 22-3. A sequence for the resonators from the input to the output is as follows:

s-p-s-p-s where p stands for parallel resonator s stands for series resonator. Resonators of the same type are already combined.

The two parallel branches are already electrically connected to one another on the chip and a connection to the housing only occurs subsequently. The equivalent circuit diagram for the selection behavior in the range $f<<f_0$ and $f>>f_0$ is shown in FIG. 23. The inductance $L_{ser}$ corresponds to an inductance between the connection of the parallel resonators on the chip and the housing ground pin outside. The filter from 22 has a filter characteristic as identified by curve 24-1 in FIG. 24. The comparison to the filter curve 24-2, where the parallel branches are not connected on the chip, clearly shows how the frequency position of the pole points in the stop band given a typical inductance $L_{ser}=1.0$ nH is shifted due to the connection of the two parallel branches on the chip. The selection is increased by more than 8 dB in the frequency range between the vertical lines (the typical frequency range for LO suppression and image suppression at a high intermediate frequency).

FOURTH EMBODIMENT

Figure 25:
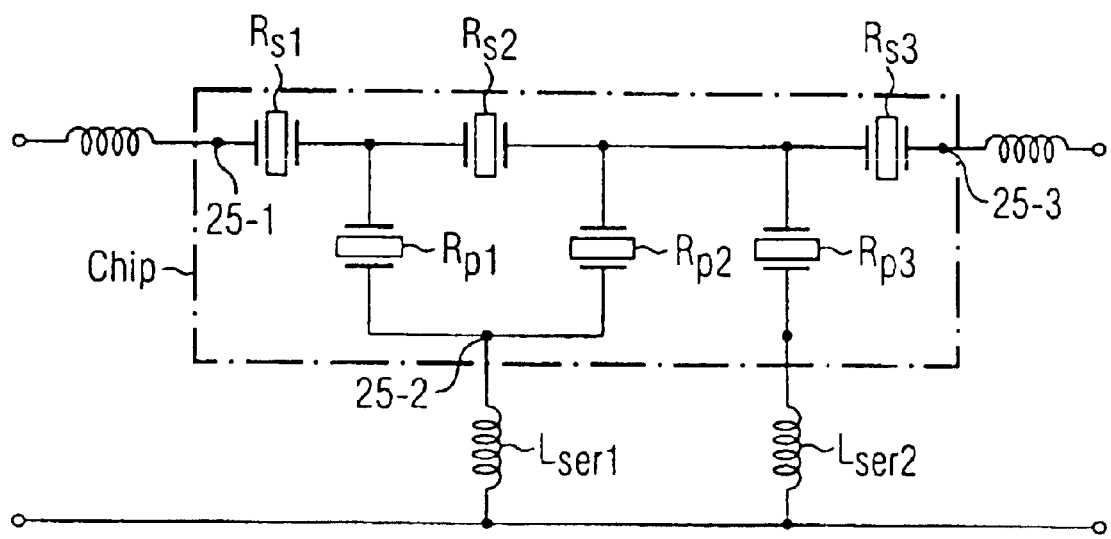
FIG. 25 is a schematic diagram of a fourth embodiment alternative embodiment of a filter with four basic elements.
Figure 26:
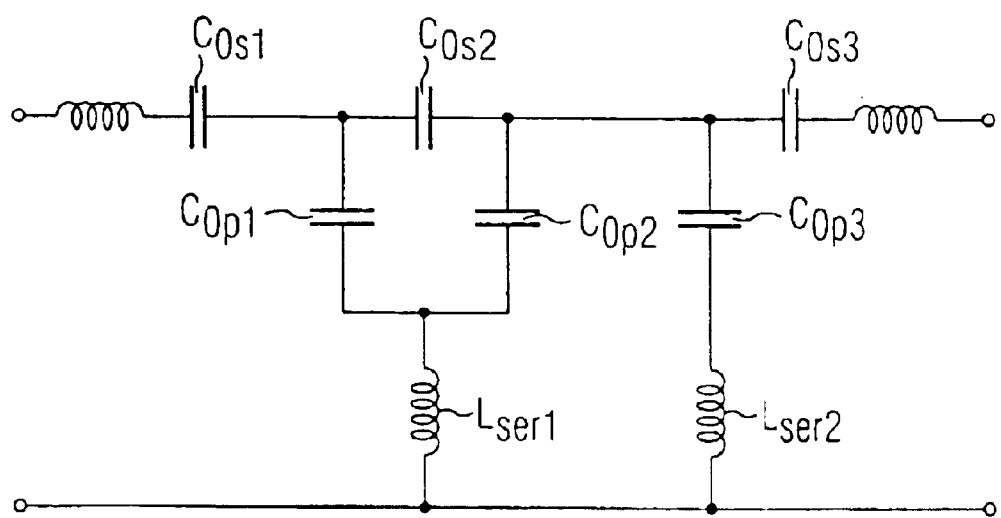
FIG. 26 is an equivalent circuit diagram of the fourth embodiment circuit shown in FIG. 25 in the stop band.
Figure 27:
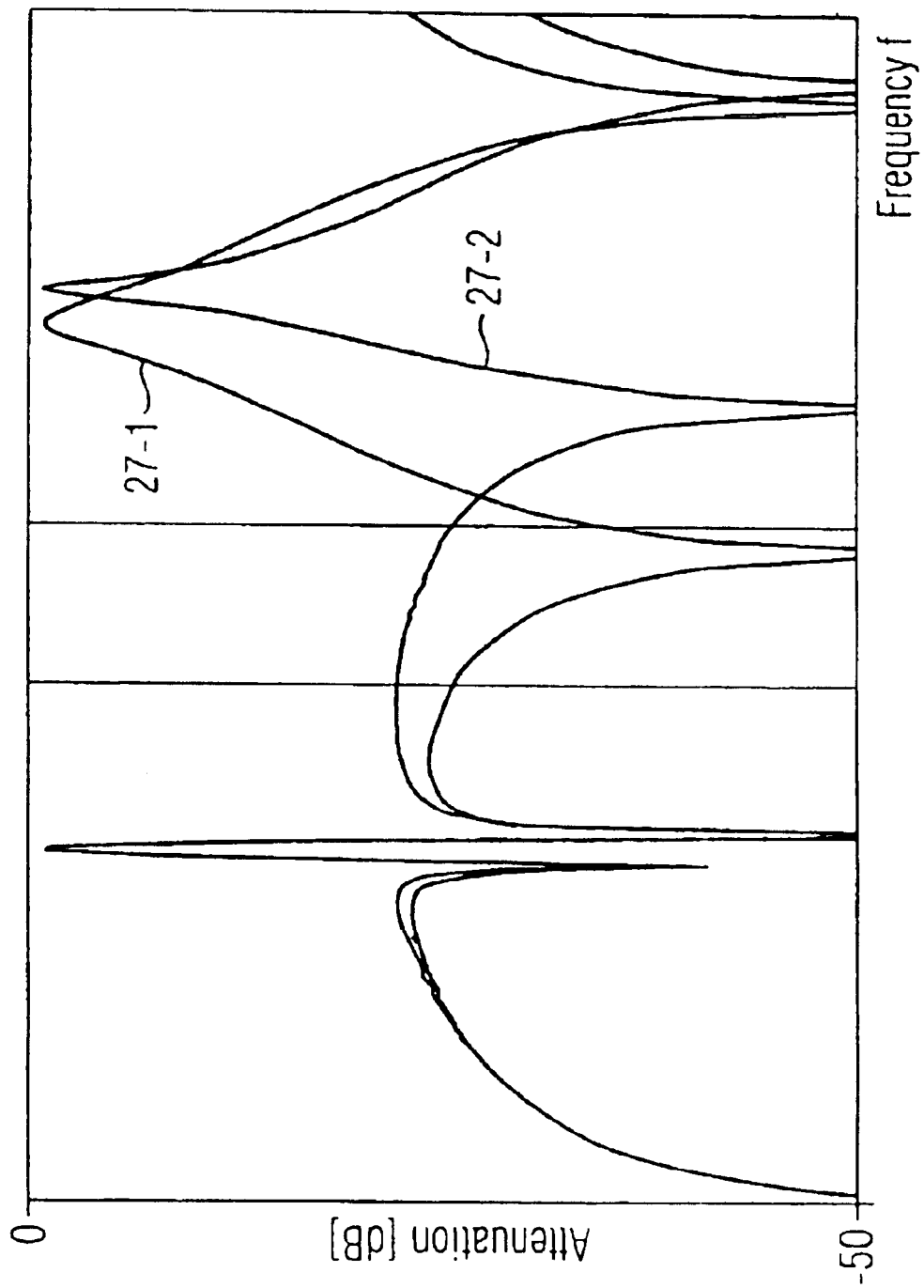
FIG. 27 is a graph illustrating the filter characteristic of the fourth embodiment circuit shown in FIG. 25.

A fourth embodiment (Embodiment 4) is illustrated in FIGS. 25–27 in which a structure and four basic elements and employed. A first basic element is connected to the input port 25-1 such that only the series branch having the resonator $R_{S1}$ comprises a connection to the input port. The second basic element is connected in a mirrored fashion because of the matching demand $Z_{out}=Z_{in}$. Basic element 3, 4 follows in the same way. Just as at the input port, only one series branch is thus directly connected to the output port 25-3. A sequence for the resonators from input to output is as follows:

s-p-s-p-s

Resonators of the same type are already combined; in contrast to Embodiment 3, however, one parallel branch has been intentionally divided again. The division ensues such that each parallel resonator $R_{p2}$, $R_{p3}$ forms its own two-port with its own electrical inputs and outputs. The combined parallel branch having the resonator $R_{p1}$ together with one of the non-combined, two parallel branches ($R_{p2}$) are already electrically connected to one another on the chip at 25-2, and a connection to the housing only ensues subsequently in the fabrication via $L_{ser1}$. The remaining parallel branch ($R_{p3}$) is connected to the housing independently. The equivalent circuit diagram for the selection behavior in the range $f<<f_0$ and $f>>f_0$ is shown in FIG. 26. The inductance $L_{ser1}$ corresponds to an inductance between the connection of the parallel resonators $R_{p1}$ and $R_{p2}$ on the chip and the housing ground pin outside; the inductance $L_{ser2}$ corresponds to an inductance between the parallel resonator $R_{p3}$ on the chip and the housing ground pin outside.

The filter from FIG. 25 has filter characteristic that is characterized by curve 27-1 in FIG. 27. The comparison to the filter curve 27-2, in which the output sides of the parallel branches are not connected on the chip, clearly shows how the frequency position of the pole points in the stop band a typical inductance $L_{sesr1}=1.0$ nH is shifted due to the connection of two of the three parallel branches on the chip. The selection is increased generally by more than 5 dB in the frequency range between the vertical lines (the typical frequency range for LO suppression and image suppression given a high intermediate frequency). The selection gain is far more than 10 dB when either a high LO suppression or image suppression is demanded.

FIFTH EMBODIMENT

Figure 28:
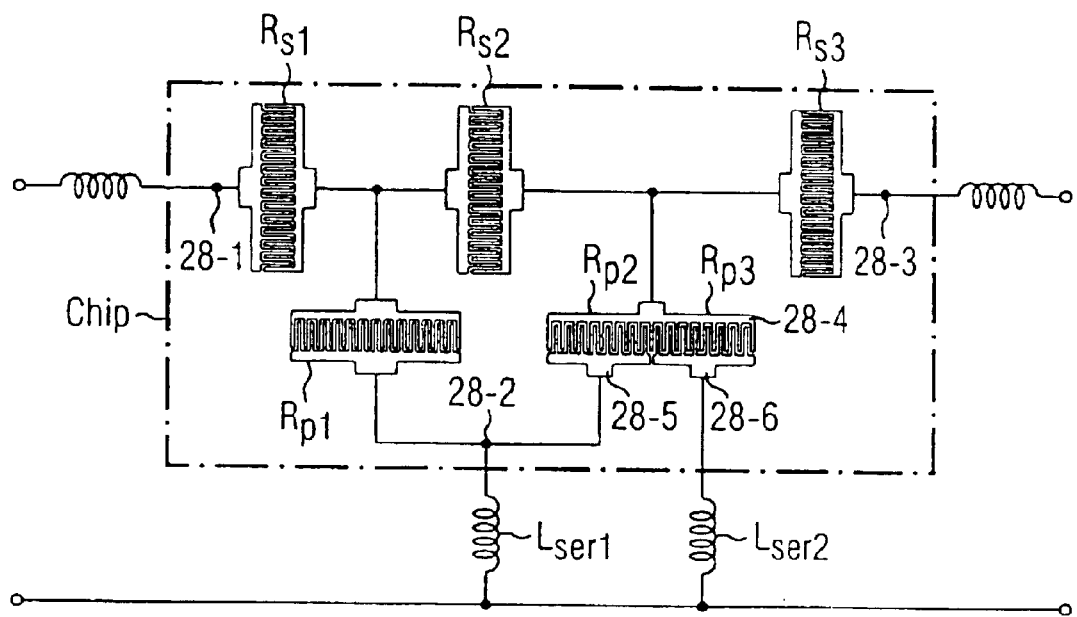
FIG. 28 is a schematic diagram of a fifth alternative embodiment of a filter with four basic elements.
Figure 29:
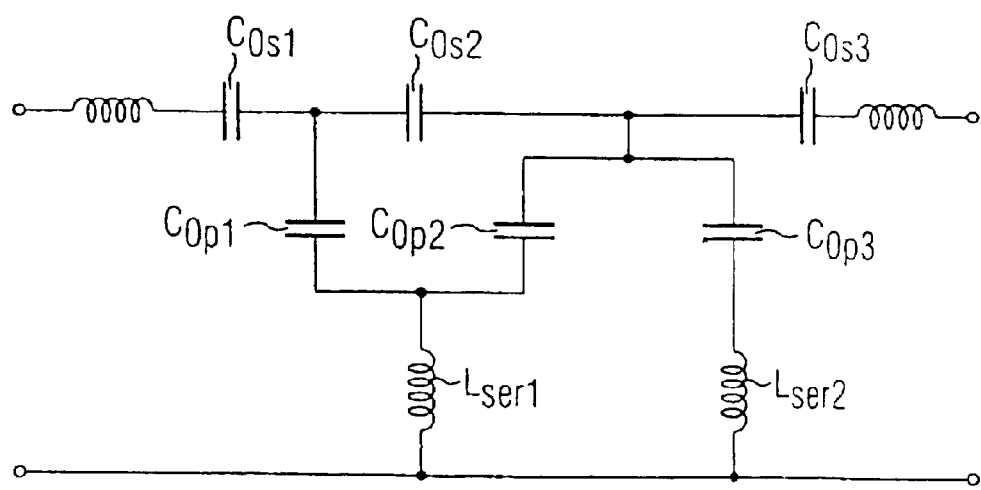
FIG. 29 is an equivalent circuit diagram of the fifth embodiment circuit shown in FIG. 28 in the stop band.
Figure 30:
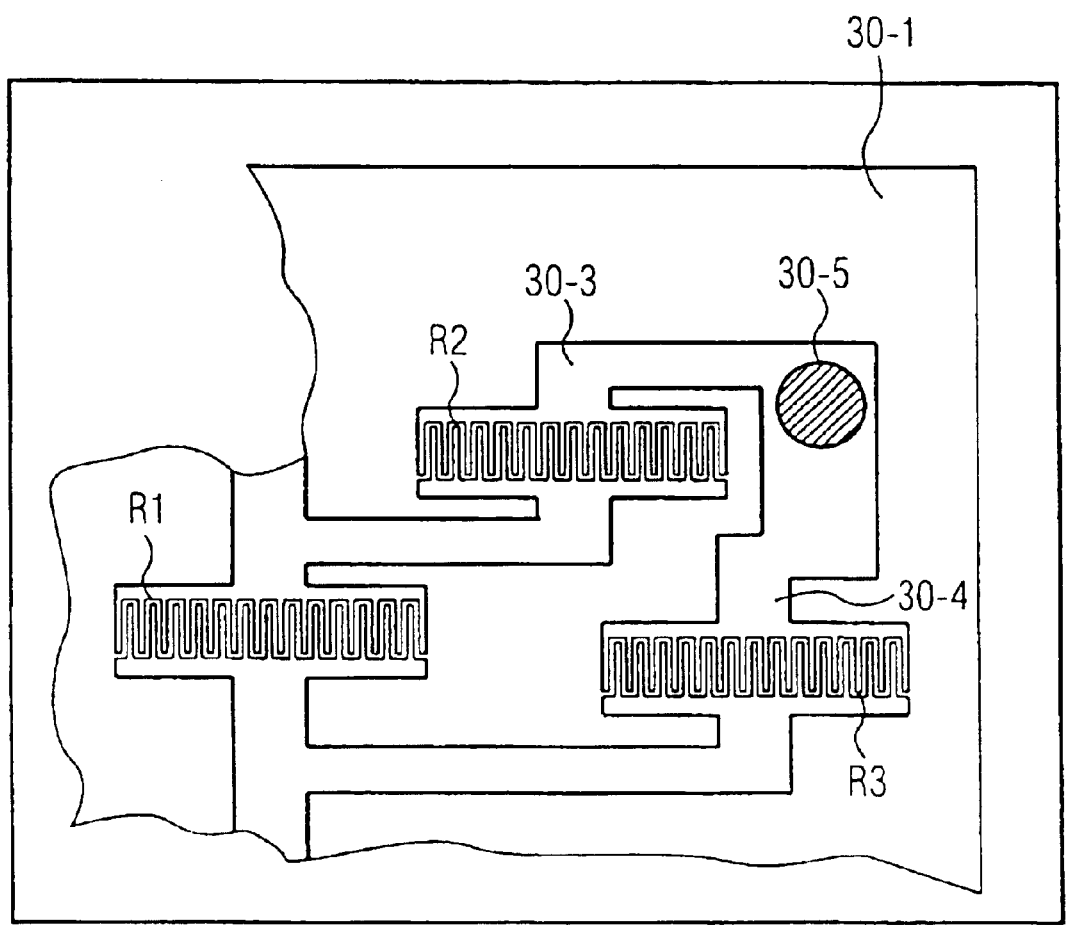
FIG. 30 is a plan view of the filter structure in a sixth embodiment with a bump connection.

A fifth embodiment (Embodiment 5) of the invention is illustrated in FIGS. 28–30. FIG. 28 symbolically shows the structure of the inventive Embodiment 5 in which a structure having four basic elements is employed. A first basic element is connected to the input port 28-1 such that only the series branch comprises a connection to the input port. The second basic element is connected according to the matching demand $Z_{out}=Z_{in}$. Basic element 3, 4 follows in the same way. Just as at the input port, only one series branch is directly connected to the output port 28-3. A sequence for the resonators from input to output derives as follows:

s-p-s-p-p-s

Resonators of the same type are already combined similar to embodiment 4; however, one parallel branch is intentionally divided again. The division, however, does not ensue into two parallel resonators that are independent of one another but in the form of a three-port configuration. The input 4 of both parallel resonators is composed of a shared terminal strip 28-4 at which the interdigital fingers to be excited lie. The terminal strip of the output is divided into two bus bars 28-5 and 28-6, where each bus bar corresponds to the output of one of the two parallel resonators.

The parallel branch with the resonator $R_{p1}$ together with one of the non-combined parallel resonators $R_{p2}$ are already electrically connected to one another on the chip at the ground output 28-2. A connection to the housing only ensues subsequently in the fabrication. The remaining parallel branch with the parallel resonator $R_{p3}$ is connected to the housing independently. The equivalent circuit diagram for the selection behavior in the range $f<<f_0$ and $f>>f_0$ is shown in FIG. 29. It is basically comparable to the equivalent circuit diagram in FIG. 26. The inductance $L_{ser1}$ corresponds to an inductance between the connection of the parallel resonators $R_{p1}$ and $R_{p2}$ on the chip and the housing ground pin outside; the inductance $L_{ser2}$ corresponds to a further inductance between the non-coupled resonator $R_{p3}$ and the housing ground pin outside.

The filter from FIG. 28 has a filter characteristic that does not differ from the filter from FIG. 26 and is therefore also characterized by curve 27-1 in FIG. 27. In contrast to the embodiment 4, a different form of the division of a parallel resonator is shown, which differs essentially in the layout but not in the effect on the selection behavior.

Figure 31:
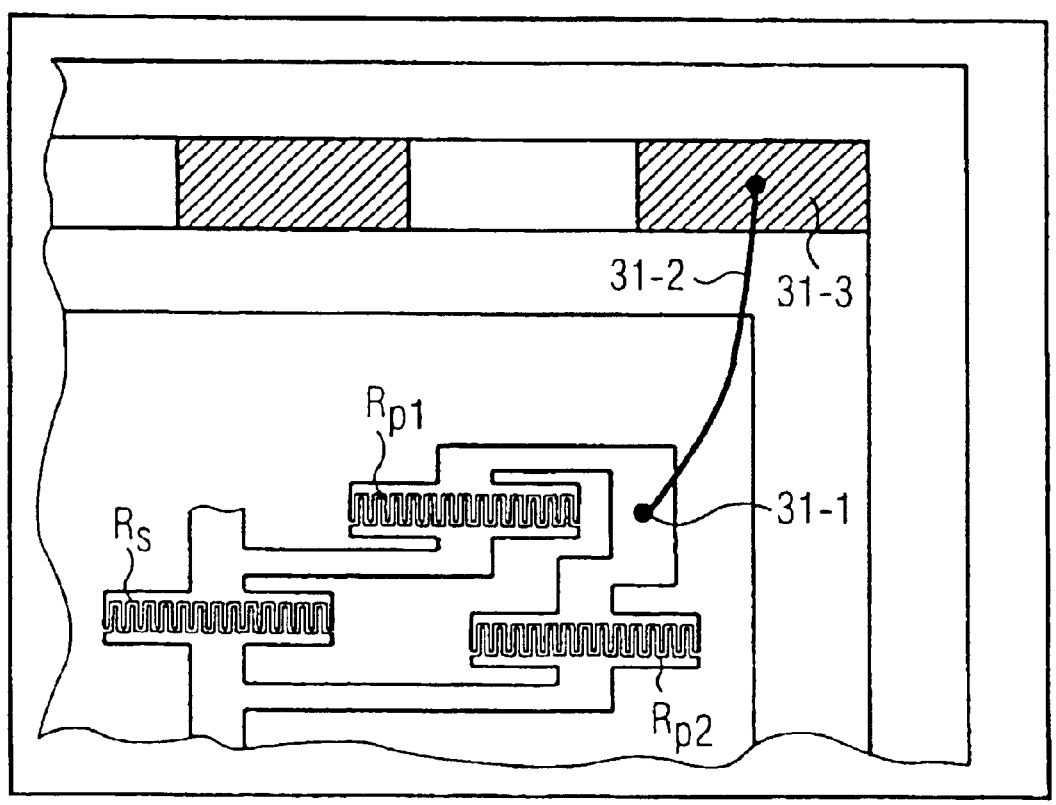
FIG. 31 is a plan view of the filter structure with a bond connection.

FIG. 31 shows portions of an inventive filter structure as a schematic plan view onto a substrate. The resonators R are shown as interdigital transducers. The two coupled resonators $R_{p1}$ and $R_{p2}$ in the parallel branch are electrically connected to one another on the substrate and comprise a shared ground connection 31-1 that is connected to a ground terminal pad 31-3 by a bond wire 31-2, which represents one part of the inductance $L_{ser}$. The connection on the substrate is realized here with a stripline but can also comprise a bond wire. Even though only two coupled resonators are shown here, the invention also covers filters having more than two coupled resonators.

SIXTH EMBODIMENT

The description of a sixth embodiment (Embodiment 6) of the present invention is shown in FIG. 30, which uses a SAW filter of the reactance filter type having at least two parallel branches. In at least two of all existing parallel branches R2 and R3, the output sides (30-3 and 30-4) of the parallel resonators are electrically connected to one another electrically on the chip. The connection 30-5 to the housing only ensues subsequently in the fabrication. The remaining parallel branches are connected to the housing independently. The connection of the chip (30-1) to the housing is not implemented as described previously (as a bond connection) but is produced with a bump connection (30-5).

The equivalent circuit diagram for the selection behavior in the range $f<<f_0$ and $f>>f_0$ is not different compared to the general exemplary embodiment and shown in FIG. 13. The inductance $L_{ser}$ corresponds to an inductance between the connection of the parallel resonators on the chip and the housing ground pin outside. For bump technology structuring, the value for the inductance $L_{ser}$ is greatly reduced compared to an embodiment with bond wire since the bond connection itself has its nearly no inductance in contrast to a bond connection. Only the inductive part of the stripline on the chip and the housing lead-through inductance up to the external housing ground pin remain.

Fundamentally, all of the exemplary embodiments discussed above (even though it is with more than four basic elements having at least two parallel branches at the output side already electrically connected on the chip) can be realized in conjunction with the bump technology. The filter characteristics are also fundamentally comparable; however, the value that can be achieved for the serial inductance $L_{ser}$ is lower. In order to achieve the required selections (for example, in the range of the LO suppression and/or image suppression) it is thus necessary to employ the inventive method for targeted variation of the stop band. The invention also offers the advantage of reducing the number of necessary ground bumps and, thus, the chip area for ground terminals. This results in an even further miniaturization of the overall SAW filter.

This miniaturization can permit the overall filter size to be smaller than or equal to 2.5×2.0 mm².

The above-described devices are illustrative of the principles of the present invention. Numerous modifications and adaptations will be readily apparent to those skilled in this art without departing from the spirit and scope of the present invention.

What is claimed is:

1. A surface-active wave (SAW) filter of a reactance filter type, comprising:

a first SAW resonator in a parallel branch of the filter that has a static capacitance;

a further first SAW resonator in a further parallel branch of the filter that has a static capacitance;

a second SAW resonator in a serial branch of the filter that has a static capacitance;

at least one basic element fashioned on a piezoelectric substrate, the basic element comprising the first SAW resonator and the second SAW resonator;

an electrical connection of ground sides of the first SAW resonator and of the further first SAW resonator (collectively, two first resonators), the electrical connection of the ground sides being connectable before bonding to a housing that contains the filter; and a bump connection on a housing link of the two electrically connected ground sides of the two first resonators;

wherein at least the static capacitance of the first SAW resonator and the static capacitance of the further first SAW resonator differ from one another; and wherein at least one of the first SAW resonator and the further first SAW resonator is divided into two individual parallel resonators, and an output side of one of the individual parallel resonators is electrically connected to the other of the first SAW resonator and the further first SAW resonator at the ground side.

2. The SAW filter according to claim 1, wherein the electrical connection comprises a stripline on the substrate.

3. The SAW filter according to claim 1, wherein the filter is configured to be installed in a housing via a flip-chip technique.

4. The SAW filter according to claim 3, wherein the overall filter size of the total filter including housing and filter is smaller than or equal to 2.5×2.0 mm².

5. A method for manufacturing SAW filter, comprising:

shifting a pole point in the SAW filter;

raising or lowering a static capacitance of at least one of a first SAW resonator and a further list SAW resonator; and raising or lowering a static capacitance of one or more further, non-coupled first resonators such that an overall sum of the static capacitances of all parallel resonators remains constant.

6. A method according to claim 5, further comprising:

raising or lowering the static capacitance of a second SAW resonator to a starting value; and raising or lowering, for compensation, a static capacitance of one or more further, second resonators lying in a serial branch between coupled first resonators such that an overall sum of the static capacitances of all series resonators remains constant.

7. A method according to claim 5, further comprising:

dividing at least one of the first SAW resonator and the a further first SAW resonator into two coupled resonators that are parallel to one another, each of the coupled resonators having static capacitance; and setting a frequency position of a coupled pole by varying a ratio of the static capacitance of the two coupled resonators.

8. A method according to claim 5, further comprising:

varying a product of the static capacitances of the first SAW resonator and the further first SAW resonator in such a way that the static capacitance of the a first resonator is raised by a same amount by which the static capacitance of the further first resonator is lowered, so that a sum of the static capacitances remains constant.

* * * * *